United States Patent
Zhu et al.

(10) Patent No.: US 11,675,148 B2
(45) Date of Patent: Jun. 13, 2023

(54) OPTICAL PATH DISPLACEMENT COMPENSATION-BASED TRANSMISSION OPTICAL POWER STABILIZATION ASSEMBLY

(71) Applicant: Accelink Technologies Co., Ltd., Wuhan (CN)

(72) Inventors: Hu Zhu, Wuhan (CN); Shujian Du, Wuhan (CN); Yanling Guo, Wuhan (CN); Hongyang Liu, Wuhan (CN); Rikai Zhou, Wuhan (CN); Yongan Fu, Wuhan (CN); Liping Sun, Wuhan (CN)

(73) Assignee: Accelink Technologies Co., Ltd.

( * ) Notice: Subject to any disclaimer, the term of this patent is extended or adjusted under 35 U.S.C. 154(b) by 0 days.

(21) Appl. No.: 17/624,714

(22) PCT Filed: Dec. 13, 2019

(86) PCT No.: PCT/CN2019/125275
§ 371 (c)(1),
(2) Date: Jan. 4, 2022

(87) PCT Pub. No.: WO2021/000526
PCT Pub. Date: Jan. 7, 2021

(65) Prior Publication Data
US 2022/0252799 A1    Aug. 11, 2022

(30) Foreign Application Priority Data

Jul. 4, 2019   (CN) .......................... 201910597260.4

(51) Int. Cl.
*H04B 10/00* (2013.01)
*G02B 6/42* (2006.01)

(52) U.S. Cl.
CPC ......... *G02B 6/4266* (2013.01); *G02B 6/4204* (2013.01); *G02B 6/4296* (2013.01)

(58) Field of Classification Search
CPC combination set(s) only.
See application file for complete search history.

(56) References Cited

U.S. PATENT DOCUMENTS

| 4,695,697 A | * | 9/1987 | Kosa | A61B 18/20 |
| | | | | 385/94 |
| 4,994,059 A | * | 2/1991 | Kosa | A61B 18/24 |
| | | | | 606/7 |

(Continued)

FOREIGN PATENT DOCUMENTS

| CN | 1350188 A | 5/2002 |
| CN | 101762852 A | 6/2010 |

(Continued)

OTHER PUBLICATIONS

International Search Report for PCT/CN2019/125275 dated Mar. 19, 2020. 2 pgs.

(Continued)

*Primary Examiner* — Agustin Bello
(74) *Attorney, Agent, or Firm* — Lerner David LLP

(57) ABSTRACT

An optical-path-displacement-compensation-based emission optical power stabilization assembly, comprising: a laser, a lens, and an optical fiber coupling port disposed on a first substrate and a second substrate according to a preset arrangement scheme, wherein an expansion coefficient of the second substrate is larger than that of the first substrate, and the preset arrangement scheme enables initial distances between the laser and the lens, between the lens and the optical fiber coupling port, and/or between the laser and the optical fiber coupling port to differ from respective optical coupling distances from an optical coupling point by a preset value, thereby ensuring that a coupling loss on an optical path changes along with the temperature, forming a complementary effect with respect to an optical power-temperature (Continued)

curve of the laser, which reduces a temperature-caused fluctuation of the emission optical power of an optical assembly.

20 Claims, 9 Drawing Sheets

(56) References Cited

U.S. PATENT DOCUMENTS

| | | | | |
|---|---|---|---|---|
| 5,216,730 A * | 6/1993 | Demeritt | ............ | G02B 6/4204 385/33 |
| 5,265,177 A * | 11/1993 | Cho | ............ | G02B 6/42 385/28 |
| 5,319,195 A * | 6/1994 | Jones | ............ | B23K 26/043 219/121.62 |
| 5,416,867 A * | 5/1995 | Thorsten | ............ | G02B 6/264 385/75 |
| 5,418,700 A * | 5/1995 | Demeritt | ............ | H01S 5/02253 362/267 |
| 5,485,538 A * | 1/1996 | Bowen | ............ | G02B 6/4246 385/10 |
| 5,751,877 A * | 5/1998 | Ishizaka | ............ | G02B 6/4237 385/88 |
| 5,758,950 A * | 6/1998 | Naoe | ............ | G02B 6/4239 362/259 |
| 5,848,082 A * | 12/1998 | Shum | ............ | G02B 6/4257 257/712 |
| 5,924,290 A * | 7/1999 | Yoshino | ............ | G02B 6/4272 165/185 |
| 5,977,567 A * | 11/1999 | Verdiell | ............ | G02B 6/4272 257/680 |
| 6,002,702 A * | 12/1999 | Haeusler | ............ | G01J 3/10 359/254 |
| 6,120,191 A * | 9/2000 | Asakura | ............ | G02B 6/4206 385/33 |
| 6,345,138 B1 * | 2/2002 | Kawai | ............ | G02B 6/3636 385/52 |
| 6,853,505 B2 * | 2/2005 | Sato | ............ | G02B 6/4206 359/821 |
| 7,021,835 B1 * | 4/2006 | Vandenberg | ............ | G02B 6/4201 385/38 |
| 7,038,866 B2 * | 5/2006 | Yoshimoto | ............ | G02B 6/4204 385/94 |
| 7,099,534 B2 * | 8/2006 | Kato | ............ | C07K 14/37 385/33 |
| 7,520,683 B2 * | 4/2009 | Takai | ............ | G02B 6/4201 385/92 |
| 9,213,138 B2 * | 12/2015 | Lin | ............ | G02B 6/4239 |
| 9,618,619 B2 * | 4/2017 | Rezk | ............ | G01S 7/497 |
| 10,119,816 B2 * | 11/2018 | Slotwinski | ............ | G01S 7/491 |
| 10,180,546 B2 * | 1/2019 | Kondo | ............ | G02B 6/421 |
| 10,663,588 B2 * | 5/2020 | Steffey | ............ | G01S 17/42 |
| 11,161,773 B2 * | 11/2021 | Flemming | ............ | G03F 7/0042 |
| 2002/0009113 A1 * | 1/2002 | Miyokawa | ............ | G02B 6/4237 372/50.1 |
| 2002/0009265 A1 * | 1/2002 | Ichigi | ............ | G02B 6/30 385/88 |
| 2002/0037142 A1 * | 3/2002 | Rossi | ............ | G02B 6/424 385/88 |
| 2002/0048291 A1 | 4/2002 | Koyanagi | | |
| 2002/0114593 A1 | 8/2002 | Terada et al. | | |
| 2003/0044132 A1 * | 3/2003 | Nasu | ............ | G02B 6/4286 372/33 |
| 2003/0095346 A1 * | 5/2003 | Nasu | ............ | G02B 6/4208 359/820 |
| 2003/0174976 A1 * | 9/2003 | Fukuda | ............ | G02B 6/4243 385/93 |
| 2004/0208422 A1 * | 10/2004 | Hagood | ............ | G02B 6/3578 385/16 |
| 2004/0247240 A1 * | 12/2004 | Teramura | ............ | G02B 6/4206 372/50.1 |
| 2005/0083566 A1 * | 4/2005 | Zappettini | ............ | G02F 1/0305 359/322 |
| 2005/0275958 A1 * | 12/2005 | Yoshimoto | ............ | G02B 7/008 359/819 |
| 2006/0056780 A1 * | 3/2006 | Takai | ............ | G02B 6/4271 385/92 |
| 2007/0098415 A1 | 5/2007 | Lupo et al. | | |
| 2008/0192803 A1 * | 8/2008 | Riza | ............ | G01K 11/125 374/161 |
| 2008/0297808 A1 * | 12/2008 | Riza | ............ | G01B 9/0209 356/630 |
| 2009/0296776 A1 * | 12/2009 | Riza | ............ | G01J 5/0014 374/130 |
| 2013/0011102 A1 * | 1/2013 | Rinzler | ............ | G02B 6/262 385/94 |
| 2013/0195408 A1 | 8/2013 | Hermeline et al. | | |
| 2013/0223798 A1 | 8/2013 | Jenner et al. | | |
| 2014/0161391 A1 * | 6/2014 | Ohata | ............ | G02B 6/42 385/33 |
| 2014/0204363 A1 * | 7/2014 | Slotwinski | ............ | G01S 17/89 356/4.01 |
| 2015/0177379 A1 * | 6/2015 | Smith | ............ | G01S 7/4817 356/5.09 |
| 2015/0241636 A1 * | 8/2015 | Ohata | ............ | G02B 6/4267 359/820 |
| 2015/0355327 A1 * | 12/2015 | Goodwin | ............ | G01S 7/4812 359/198.1 |
| 2017/0168252 A1 | 6/2017 | Pezeshki et al. | | |
| 2019/0079253 A1 | 3/2019 | Koumans et al. | | |
| 2022/0252799 A1 * | 8/2022 | Zhu | ............ | G02B 6/4267 |

FOREIGN PATENT DOCUMENTS

| | | |
|---|---|---|
| CN | 1960087 B | 1/2012 |
| CN | 102866470 A | 1/2013 |
| CN | 103246024 A | 8/2013 |
| CN | 103852835 A | 6/2014 |
| CN | 108474911 A | 8/2018 |
| CN | 108803711 A | 11/2018 |
| CN | 109073843 A | 12/2018 |
| CN | 110320617 A | 10/2019 |
| JP | S61284162 A | 12/1986 |
| JP | 2002182076 A | 6/2002 |
| JP | 200725433 A | 2/2007 |

OTHER PUBLICATIONS

Search Report for Chinese Application No. 201910597260.4 dated Jan. 20, 2020. 2 pgs.
Search Report for Chinese Application No. 201910597260.4 dated Jun. 28, 2020. 2 pgs.

* cited by examiner

OPTICAL PATH DISPLACEMENT COMPENSATION-BASED TRANSMISSION OPTICAL POWER STABILIZATION ASSEMBLY

CROSS-REFERENCE TO RELATED APPLICATION

The present application is a national phase entry under 35 U.S.C. § 371 of International Patent Application No. PCT/CN2019/125275 filed on Dec. 13, 2019, which claims priority from Chinese Application No. 201910597260.4 filed Jul. 4, 2019, all of which are incorporated herein by reference in their entirety.

TECHNICAL FIELD OF THE DISCLOSURE

The present disclosure relates to the technical field of optoelectronic device packaging, in particular to an optical-path-displacement-compensation-based emission optical power stabilization assembly.

BACKGROUND

In the optical communication link, the optical power of the emission optical assembly must not fluctuate too much. Once the optical communication link is determined, the link loss and the sensitivity of the receiving end are determined. When the emission optical power becomes larger, the optical power transmitted to the receiving end may exceed the overload optical power of the receiving end, causing serious errors or even damaging to the detector; when the emission optical power becomes smaller, the optical power transmitted to the receiving end may not be detected. Therefore, it is very important to maintain the emission optical power of the optical assembly in a stabilized range. For example, 400G FR4 MSA requires the emission optical power range to be −3.3~+3.5 dBm, and some clients tend to require the emission optical power range to be narrower than the standard range. The optical power Pout of the optical emission assembly is determined by the emission optical power of the laser and optical path loss.

$$P_{out}=P_{LD}-P_{loss}$$

Where $P_{LD}$ represents the output optical power of the laser, and $P_{loss}$ represents the optical path loss, including coupling loss, transmission loss, and demultiplexing loss. After the optical assembly is packaged, the optical path is fixed, and in the working temperature range of the assembly, the optical path loss tends to fluctuate little, while the output optical power of the laser decreases sharply along with an increase in temperature. Therefore, the output optical power of the optical emission assembly also decreases sharply with the increase in temperature. At present, an adapted method is as described in a Chinese patent (patent number: CN1960087B): a portion of light from a laser is split and come into a backlight detector, and a driving current is adjusted when the detector detects a change in optical power, i.e. the driving current increases when the power becomes smaller and the driving current decreases when the power becomes larger, in order to compensate power changes caused by temperature changes.

The change of the driving current tends to change the bandwidth and extinction ratio of the laser, which needs other hardware parameters to be adjusted jointly, and if the joint adjustment is not matched, the signal stability will be reduced. More importantly, the output current of the laser driving chip has a certain time-delay characteristic, and moreover, frequent control will also bring about the occupation and waste of processing chip resources.

Therefore, overcoming the defects existing in the present prior art is a problem to be urgently solved in the present technical field.

SUMMARY

The technical problem to be solved in the present disclosure is as follows: the output current of the laser driving chip has a certain time-delay characteristic, and frequent control will also bring about the occupation and waste of processing chip resources.

Embodiments of the present disclosure adopt the following technical solutions.

The present disclosure provides an optical-path-displacement-compensation-based emission optical power stabilization assembly, which comprises a laser, a lens and an optical fiber coupling port;

wherein the laser, the lens, and the optical fiber coupling port are disposed on a first substrate and a second substrate according to a preset arrangement scheme; wherein an expansion coefficient of the second substrate is larger than an expansion coefficient of the first substrate;

the arrangement scheme enables initial distances between the laser and the lens, between the lens and the optical fiber coupling port and/or between the laser and the optical fiber coupling port to differ from respective optimal coupling distances from an optical coupling point by a preset value; and the arrangement scheme enables one or more objects among the laser, the lens, and the optical fiber coupling port which are fixed on the second substrate to generate an offset along with the elongation action of the second substrate when a working temperature of the emission optical power stabilization assembly increases, wherein the offset is used to compensate the preset value, enabling the laser, the lens, and/or the optical fiber coupling port to close to the optimal coupling point.

Preferably, the arrangement scheme comprises: the laser and the lens are on the first substrate, and the optical fiber coupling port is on the second substrate; or the laser and the optical fiber coupling port are on the first substrate, and the lens is on the second substrate; or the lens and the optical fiber coupling port are on the first substrate, and the laser is on the second substrate.

Compared with the prior art, the embodiments of the present disclosure has following beneficial effects:

Through an ingenious optical path design, the present disclosure ensures that a coupling loss on an optical path changes along with the temperature, thereby forming a complementary effect with respect to an optical power-temperature curve of the laser, which reduces a temperature-caused fluctuation of the emission optical power of an optical assembly.

BRIEF DESCRIPTION OF THE DRAWINGS

In order to more clearly explain the technical solutions of the embodiments of the present disclosure or the technical solutions in the prior art, the drawings that need to be used in the description of embodiments or the prior art will be briefly introduced below. Obviously, the drawings in the following description are only some embodiments of the present disclosure, and for those ordinary skill in the art, other drawings can be obtained based on these drawings without inventive labor.

DETAILED DESCRIPTION

Figure 1:
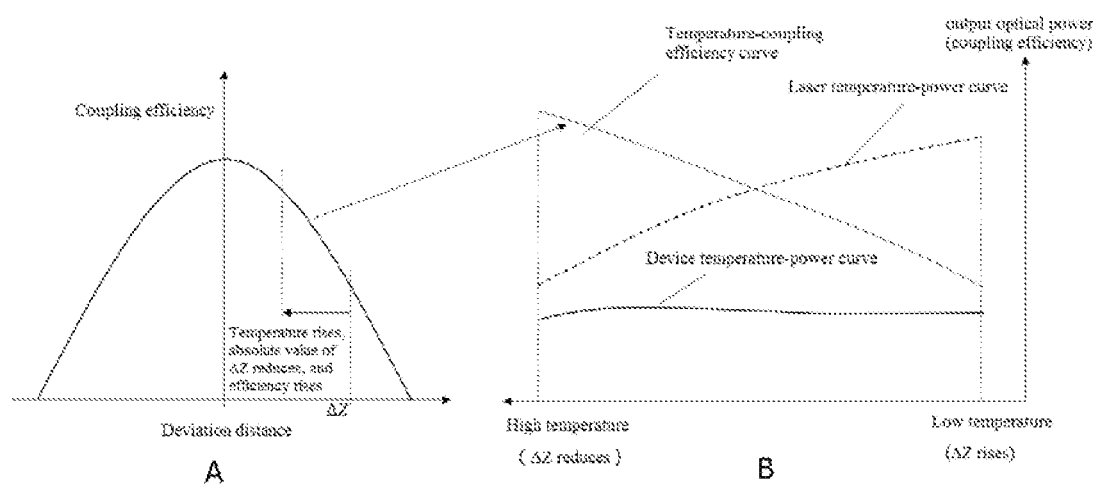
FIG. 1 is a schematic diagram showing a complementary relationship of a curve between the coupling efficiency and laser temperature.

In order to make the objects, technical solutions and advantages of the present disclosure more obvious, the present disclosure is further described in detail below with reference to the accompanying drawings and embodiments. It shall be noted that the specific embodiments described herein are only for explaining the present disclosure but not for limiting the present disclosure.

In the description of the present disclosure, the orientations or positional relationships indicated by the terms "inner", "outer", "longitudinal", "transverse", "upper", "lower", "top", "bottom" and the like are orientations or positional relationships based on the orientations or positional relationships shown in the drawings, which are only for convenience of description of the present disclosure and not for requiring the present disclosure to be constructed and operated in a specific orientation, and therefore should not be understood as a limitation on the present disclosure.

On account of the defects in the prior art, the present disclosure proposes an optical path structure, in which the optical path loss change along with a temperature. When the temperature increases, although the output optical power of the laser decreases, the optical path loss also decreases, and the overall output optical power keeps stable. Similarly, at a low temperature, the output optical power of the laser increases, and the optical path loss also increases, and the overall output optical power also keeps stable.

Such optical path structure ensures the stability of the optical path in principle, and the effect thereof is better than feedback adjustment mechanisms through circuits, software, etc. within a certain temperature fluctuation range. It can be used alone or together with existing control methods to further improve the stability of the output optical power.

In various embodiments of the present disclosure, a "preset deviation value" is also described as a coupling deviation, in particular, a coupling deviation in an initial state. In addition, in different embodiments, the preset deviation value is also differentially described as a first specified value, a second specified value, . . . , a ninth specified value. The first specified value, the second specified value, . . . , the ninth specified value express the same meaning, and the appellation used for distinction such as first, second, or ninth are only used to facilitate the description of the solution content in each embodiment, without any specific limiting meaning.

In the embodiments of the present disclosure, the first specified value, the second specified value and the third specified value are all used to describe the "preset deviation value" in the related implementation solutions of Mode 1; the fourth specified value, the fifth specified value and the sixth specified value are all used to describe the "preset deviation value" in the related implementation solutions of mode 2; and the seventh specified value, the eighth specified value and the ninth specified value are all used to describe the "preset deviation value" in the related implementation solutions of mode 3.

Several typical solution structures of the present disclosure will be described in detail through specific embodiments in the following. The technical features involved in the various embodiments of the present disclosure described below can be combined with each other as long as they do not conflict with each other.

Embodiment 1

An embodiment of the present disclosure provides an optical-path-displacement-compensation-based emission optical power stabilization assembly (in the subsequent embodiments of the present disclosure, several typical structures are shown, such as shown in FIG. 2, FIG. 5, FIG. 9, FIG. 11, and FIG. 14), which comprises a laser, a lens, and an optical fiber coupling port. Specifically, the laser, the lens, and the optical fiber coupling port are disposed on a first substrate and a second substrate according to a preset arrangement scheme, wherein an expansion coefficient of the second substrate is larger than that of the first substrate.

The arrangement scheme enables initial distances between the laser and the lens, between the lens and the optical fiber coupling port, and/or between the laser and the optical fiber coupling port to differ by a preset deviation value from respective optimal coupling distances from an optimal coupling point.

Theoretically, the above-mentioned optimal coupling point may have multiple groups, for example, regarding different lasers and lens spacing, as long as the position of the optical fiber coupling port is adjusted correspondingly, a corresponding optimal coupling point can be obtained. However, in the real situation, the optimal coupling point that can be selected by the operator is limited due to the influence of factors such as the size of the emission optical power stabilization assembly as well as the heat dissipation, and for the embodiment of the present disclosure, the described optimal coupling point is a spacing relationship in the actual scene.

The arrangement scheme makes one or more objects among the laser, the lens, and the optical fiber coupling port which are fixed on the second substrate to generate an offset along with the elongation of the second substrate when the working temperature of the emission optical power stabilization assembly increases, and the offset is used to compensate the preset value, so that the laser, the lens, and/or the optical fiber coupling port are close to the optimal coupling point.

In different embodiments of the present disclosure, the optimal coupling point may be a coincident optimal coupling point with the above-mentioned initial optimal coupling point used as the basis for adjustment (E.g. embodiment 4, embodiment 5, etc.), or may be a newly generated optimal coupling point (E.g. embodiment 2, embodiment 3, etc.). For the optimal coupling point, it is not specifically limited.

Through an ingenious optical path design, the present disclosure ensures that a coupling loss on an optical path changes along with the temperature, thereby forming a complementary effect with respect to an optical power-temperature curve of the laser, which reduces an temperature-caused fluctuation of the emission optical power of an optical assembly.

On the basis of the technical ideas as disclosed in the present disclosure, the frame structures of the first substrate and the second substrate are evolved into the first substrate, the second substrate, the third substrate, or even a combination structure of more than three substrates, and if the implementation principle thereof is not different from that of the present disclosure, the corresponding technical solutions also fall within the protection scope of the present disclosure.

As shown in FIG. 1, since the curve of the coupling efficiency which changes along with the temperature is exactly complementary to the curve of the optical power of the laser 1 which changes with the temperature, as an experimental result, the overall output optical power is more stable. Correspondingly, when selecting the second substrate material, it is also necessary to make a decision after targeted comprehensive consideration based on the correlation between the laser temperature-power curve and temperature-coupling efficiency curve (as shown in figure B in FIG. 1, selecting appropriately may obtain an effect of a relatively flatter temperature-power curve).

Based on the implementation of the embodiment of the present disclosure, since the relevant objects at least comprise the laser, the lens, the optical fiber coupling port, the first substrate, and the second substrate, in the arrangement scheme involved, at least the following arrangement modes exist according to the layout mode of the laser, the lens, and the fiber coupling port on the first substrate and the second substrate:

Mode 1:

The laser and the lens are on the first substrate, and the optical fiber coupling port is on the second substrate. Mode 1 is a preferred implementation mode recommended by the present disclosure, and the reason thereof is that the stability requirements of the entire emission optical power stabilization assembly can be ensured during the change as described in embodiment 1 due to the property that the stability of the first substrate per se is high (compared with the expansion coefficient of the second substrate).

Mode 2:

The laser and the optical fiber coupling port are on the first substrate, and the lens is on the second substrate. Compared with mode 1, mode 2 proposes higher requirements for the installation of the second substrate, while the advantages thereof are also apparent, that is, when the method for adjusting the preset deviation value of the optimal coupling distance from the optimal coupling point is realized by adjusting the lens, the method of calculating the preset value (which is specifically described as the fourth specified distance $l_4$ in embodiment 5) corresponding to the initial coupling deviation is a most simple and directive method. Relatively speaking, because of the simplification of the calculation mode, it is also guaranteed that the laser is minimally affected by other influence factors (especially in embodiment 5, the optimal coupling point referred to by the corresponding initial state adjustment and the optimal coupling point corresponding to the maximum working temperature are the same). Therefore, mode 2 helps to improve the precision in the design and the specific work scene.

Mode 3:

The lens and the optical fiber coupling port are on the first substrate, and the laser is on the second substrate. This mode is a more distinctive implementation mode, and this mode may be selected if the directivity property of the telescopic direction of the selected second substrate material is relatively strong. The difficulty of realization thereof is that the temperature change which the second substrate is subjected to, is usually from the heating of the laser on the surface thereof, leading to the uneven heating to the second substrate in mode 3. That is the reason why the above-mentioned requirement of "the directivity property of the telescopic direction of the selected second substrate material is relatively strong" is required. After solving the above-mentioned material selection problem, the advantages of mode 3 are also very obvious, the reason of which is that the laser is directly disposed on the second substrate, and thus the response speed in mode 3 changing with the temperature of the laser is the fastest among many modes. In view of the heat dissipation requirements of the laser, the second substrate may be provided as a composite assembly of metal and polymer, wherein the laser is placed on the metal, and the polymer is connected with the first substrate.

In addition to the above-mentioned three modes, during the research and development process, other mode 4, mode 5 and mode 6 as described below are also designed.

Mode 4:

The laser and the lens are on the second substrate, and the optical fiber coupling port is on the first substrate. Compared with mode 3, the response speed and the implementation precision of this mode are certain decreased. However, relatively speaking, it can be foreseen that the processing and manufacturing difficulty of mode 4 will be relatively less than that of mode 3, because the laser and the lens are manufactured on the same second substrate, and the focusing and the installation of the both are easier compared with those of mode 3.

Mode 5:

The laser and the optical fiber coupling port are on the second substrate, and the lens is on the first substrate. Compared with other modes, mode 5 is a secondary option in the present disclosure, because compared with other solutions, for mode 5, not only it is more tedious in the complexity of the structure, but also its working stability and accuracy are also decreased.

Mode 6:

The lens and the optical fiber coupling port are on the second substrate, and the laser is on the first substrate. Mode 6 can be understood as a mirroring solution of mode 3, i.e. the implementation principle of the both is to realize the stability of the working of the emission optical power stabilization assembly at different working temperatures through making the deviation and compensation to be generated between the laser and the lens. Relatively speaking, since the second substrate needs to meet the telescopic property, it will be better that the objects disposed thereon are relatively few. In this way, if a good second substrate material can be obtained in the industry implementation of mode 3 and the requirement of "the directivity property of the telescopic direction of the second substrate material is relatively strong" is met, then mode 3 will be better than mode 6 accordingly.

The above-mentioned mode 4, mode 5 and mode 6 are feasible in form, but after rigorous analysis and argumentation from the applicant, since the common feature in mode 4, mode 5 and mode 6 is that two objects (the laser and lens, the lens and optical fiber coupling port, or the laser and optical fiber coupling port) are disposed on the second substrate, it will cause the distance between the two objects to change as well during the elongation of the second substrate along with the increase of temperature, thereby affecting the stability of the entire system. After rigorous argumentation, the above-mentioned mode 4, mode 5 and mode 6 do not possess effective practicability, therefore, they are not discussed in the subsequent embodiments of the present disclosure. There is one implementation mode that the second substrate is split into two parts in alignment with two objects originally disposed on the second substrate, thereby ensuring that the two objects on the second substrate can be relatively static. However, it is difficult to be realized in practice, because the telescopic property of components of the second substrate that respectively bear the two objects are required to be strictly consistent.

The following embodiments will gradually expand according to the pattern in the above-mentioned mode 1, mode 2 and mode 3, and explain the differences in their implementation. The above-mentioned difference especially refers to a difference which is especially reflected in the solution when the objects adjusted to produce the preset deviation value are different during the initial layout.

Figure 2:
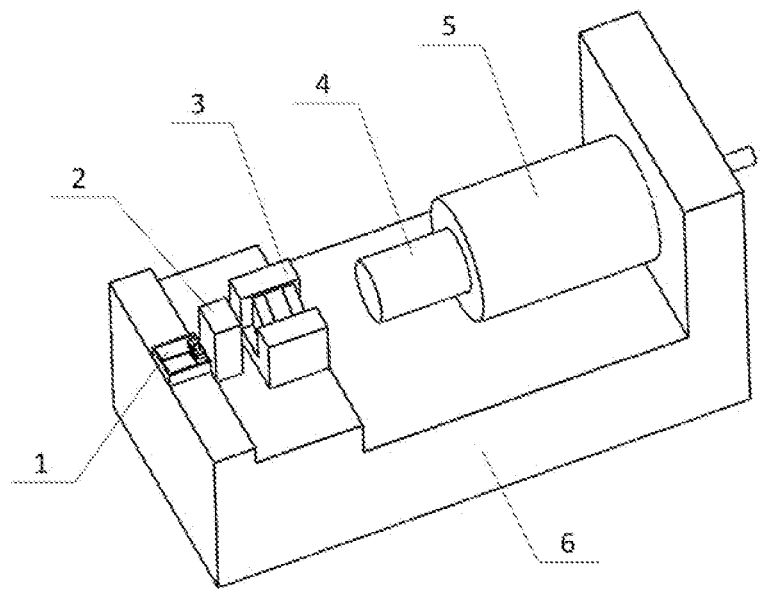
FIG. 2 is a schematic structural diagram of the corresponding device in mode 1 provided by an embodiment of the present disclosure.
Figure 4:
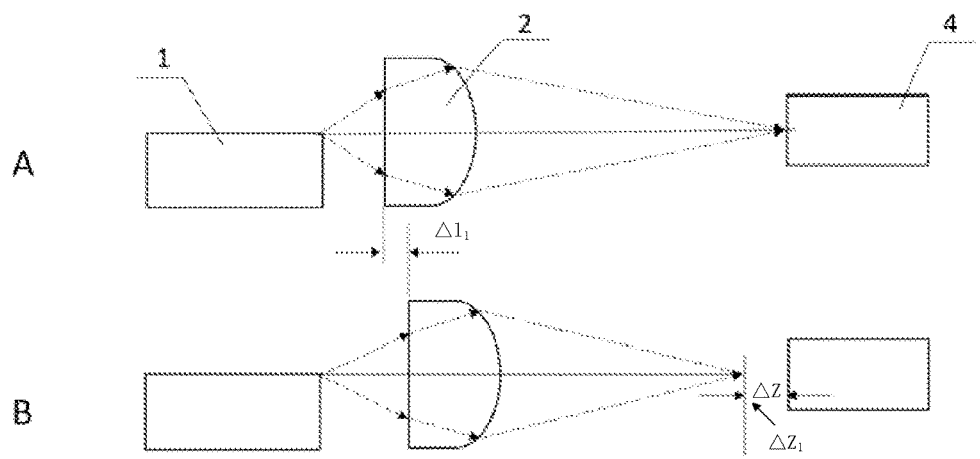
FIG. 4 is a schematic diagram of an optical path, in which the lens is offset in a direction far away from the laser, in mode 1 provided by an embodiment of the present disclosure.

It should be emphasized here that, in different embodiments, every object (the laser, the lens or the optical fiber coupling port) can be selectively operated on the adjustment of the initial coupling deviation according to different structure implementations (for example, the structure shown in FIG. 2 and the structure shown in FIG. 4). And in order to simplify the presentation of the drawings in the description, the present disclosure presents two structures when the corresponding mode 1 in embodiment 2 is described, and the present disclosure also presents two structures when mode 2 in Embodiment 5 is described. On the contrary, for the description on other modes, only one of the structures similar to FIG. 2 or FIG. 4 is provided in the drawings as an example, however, those skilled in the art can implement the corresponding un-illustrated reverse adjustment structure based on the combination of FIG. 2 and FIG. 4 and the relevance of each embodiment.

In the subsequent embodiments of the present disclosure, the description for each mode is performed by adjusting one object. However, for those skilled in the art, on the basis of the technology disclosed in the corresponding embodiments, it is also feasible to derive the implementation mode from performing adjustments for two objects or three objects. After all, the present disclosure presents the most feasible ones in the form of embodiments based on the consideration of how to effectively inherit the existing product structure, as well as the consideration of the most effective design ideas.

Embodiment 2

This embodiment of the present disclosure provides the specific implementation content when the object used for generating the preset deviation value is the lens in the initial setting process in mode 1 proposed in embodiment 1. It should be pointed out that the specified value as described in embodiment 1 is specifically expressed as the first specified distance $\Delta l_1$ in the present embodiment. The present embodiment proposes an optical-path-displacement-compensation-based emission optical power stabilization assembly, as shown in FIG. 2 to FIG. 6, including a laser 1, a lens 2, and an optical fiber coupling port 4 (because the optical isolator 3 is a non-critical feature in each embodiment of the present disclosure, i.e. it does not affect the position of the optimal coupling point, it is not presented in each embodiment in a formal content form, but only represents the existence of the optical isolator 3 in some of the drawings), wherein FIG. 3 and FIG. 5 at least provide two different telescopic coupling modes when the optical fiber coupling port 4 is on the second substrate 5. Next, the descriptions are performed one by one, and the details are as follows.

Figure 3:
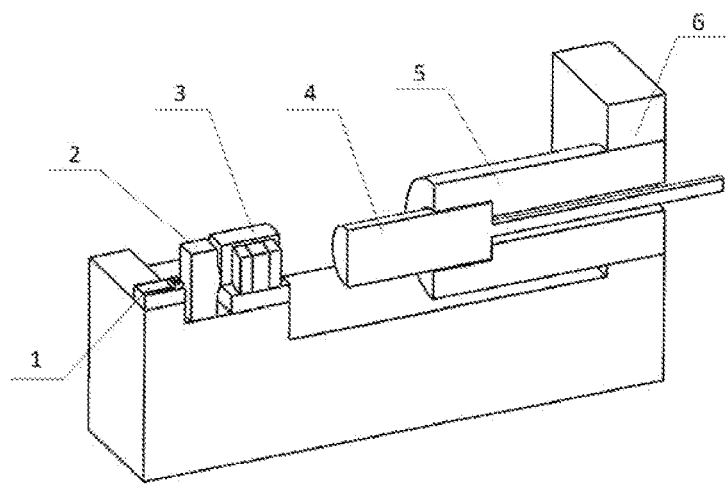
FIG. 3 is a cross-sectional view of the corresponding device in mode 1 provided by the embodiment shown in FIG. 2.

As shown in FIGS. 1 and 3, FIG. 3 is a cross-sectional view of the structure shown in FIG. 1. The laser 1 and the lens 2 are on the first substrate 6, and the optical fiber coupling port 4 is on the second substrate 5 (it can be seen from FIG. 3 that the optical fiber coupling port 4 comprises a ceramic fiber core on the left side and an optical fiber portion coupled with the ceramic fiber core, and the ceramic fiber core portion is embedded in a groove disposed in the second substrate 5 in a coaxial mode); wherein the length of the second substrate 5 is elongated along with the increase of temperature, and from the perspective shown in FIG. 3, the elongation specifically points towards the direction in which the lens 2 and the laser 1 on the left side are located.

An initial position of the lens 2 on the first substrate 6 is offset, towards a side where the optical fiber coupling port 4 is located, by the first specified distance $\Delta l_1$ on the optical axis relative to an optimal coupling point for the coupling of the lens 2 with the laser 1 and the optical fiber coupling port 4, as shown in FIG. 4. Figure A in FIG. 4 is a state schematic diagram of the optimal coupling point, and figure B in FIG. 4 is an effect schematic diagram of offsetting the first specified distance $\Delta l1$ towards the side where the optical fiber coupling port 4 is located, the applicable structure of which is similar to that of FIG. 3. The principle thereof is that in the initial state (i.e. the state shown in figure B in FIG. 4), the optimal adaptation space $Z_1$ (in the present embodiment, it specifically refers to the moving space of the optical fiber coupling port) is reserved between the laser and the optical fiber coupling port 4, and the optimal adaptation space Z1 can play a role in compensating the external equivalent working power when the working temperature of the emission optical power stabilization assembly increases and the working power of the corresponding laser decreases due to the increase of the working temperature, and finally, it is expressed that the final manifestation is that although the temperature increase causes a decrease in the working power of the laser, the optical signal power obtained by coupling at the side where the optical fiber coupling port 4 is located does not fluctuate greatly.

Figure 5:
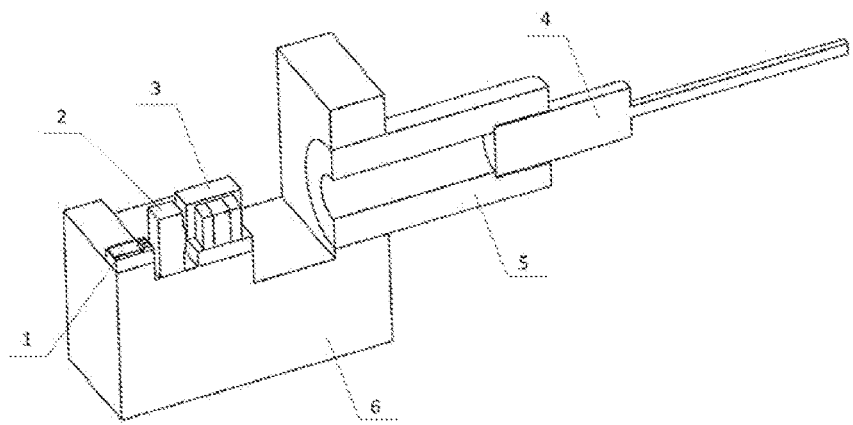
FIG. 5 is a schematic structural diagram of another device in mode 1 provided by an embodiment of the present disclosure.

In the embodiments of the present disclosure, in addition to providing FIG. 3 and the corresponding implementation mode that the initial position of the lens 2 on the first substrate 6 is offset towards the side where the optical fiber coupling port 4 is located by the first specified distance $\Delta l_1$ on the optical axis relative to the optimal coupling point for the coupling of the lens 2 with the laser 1 and the optical fiber coupling port 4, an optional mode is further provided, as shown in FIG. 5, and the details are as follows:

The initial position of the lens 2 on the first substrate 6 is offset towards a side locating the laser 1 by the first specified distance $\Delta l_1$ on the optical axis relative to the optimal coupling point for the coupling of the lens 2 with the laser 1 and the optical fiber coupling port 4. The working principle thereof is similar to that of the above-mentioned structure corresponding to FIG. 3 and FIG. 4, with the only exception that in the structure shown in FIG. 5, when the working temperature of the emission optical power stabilizing assembly increases, the elongation action of the second substrate 5 is to bring the optical fiber coupling port 4 away from the laser 1/lens 2, therefore, in order to obtain an effect similar to that of the above-mentioned "optimal adaptation space $\Delta Z_1$", it is necessary to offset the initial position by the first specified distance $\Delta l_1$ towards the side locating the laser 1 during an initial setting.

In the embodiments of the present disclosure, one end of the second substrate 5 is tightly connected to the first substrate 6 (the tight connection here is to ensure the single end fixation of the second substrate 5, so as to facilitate the realization of the telescopic change along with temperature at the other end, on the other hand, as shown in FIG. 3 and FIG. 5, the use of a cylindrical second substrate is also for improving the directivity property of the telescopic change), which is used for the length of the other end of the second substrate 5 can be elongated along with the increase of temperature when an outside temperature increases, so that the telescopic offset $\Delta Z_1$ of the optical fiber coupling port 4 brought by the second substrate 5 compensates the deviation in the optimal coupling brought by the first specified distance $\Delta l_1$ when the emission optical power stabilization assembly is close to a maximum working temperature. Since there is the maximum working temperature, there is naturally an initial temperature which can be understood as the static temperature before installation and use. For example, the working temperature range of the optical device is −5° C.~85° C., and an initial installation temperature is 20° C. When the temperature increases to 85° C., the laser power decreases by 2 dB. However, due to the thermal expansion, the optical fiber coupling port 4 is closer to the optimal coupling point, and the coupling efficiency increases by 2 dB. Similarly, when the temperature decreases to −5° C., the laser power increases by 1 dB, however, due to the cold shrinkage, the optical fiber coupling port 4 is further away from the optimal coupling point, and the coupling efficiency decreases by 1 dB. Finally, the stability of the optical power demonstrated by the side locating the optical fiber coupling port 4 is ensured.

In the embodiments of the present disclosure, a setting of the first specified distance $\Delta l1$ is based on the fact that when the working temperature of the emission optical power stabilization assembly increases, the working power of the laser will decrease in a case where the laser is not externally driven and adjusted; when the working temperature of the emission optical power stabilizing assembly decreases, the working power of the laser will increase in a case where the laser is not externally driven and adjusted. The setting of the specified distance specifically includes:

determining a maximum working temperature $T_1$ of the emission optical power stabilization assembly in practice, and $T_1$ being larger than $T_0$, and then according to a following relational expression:

$$\Delta l_1 = \frac{\varepsilon d(T_1 - T_0)}{\alpha - 1},$$

calculating the first specified distance $\Delta l_1$, wherein $\Delta Z1 = \varepsilon d(T_1 - T_0)$, where $\varepsilon$ is a thermal expansion coefficient of a second substrate material, d is a length of a freely telescopic portion of the second substrate, $T_0$ is an initial temperature of the emission optical power stabilization assembly, and $\alpha$ is an axial magnification.

In this embodiment of the present disclosure, the material of the first substrate 6 may be tungsten copper or Kovar alloy (for example, model $W_{80}Cu_{20}$, and the thermal expansion coefficient thereof is about $8 \times 10^{-6}/K$), or even a combination of the two, and the thermal expansion coefficient thereof is less than $1 \times 10^{-5}/K$. In addition, the material of the second substrate 5 may be organic glass (methyl methacrylate polymer usually has a thermal expansion coefficient of about $9 \times 10^{-5}/K$). Generally, in order to achieve a good elongation effect, the thermal expansion coefficient of the material of the second substrate 5 is at least 10 times larger than that of the material of the first substrate 6, whereby ensuring the compensation precision of the implementation process.

As shown in FIG. 3 and FIG. 5, there are two typical usable structures provided by the embodiment of the present disclosure, wherein the first substrate 6 is set with a through-hole, the shape of which matches with the shape of an outer wall of the second substrate 5, and the second substrate 5 is close to the lens 2 and is in a freely telescopic state, such that the optical fiber coupling port 4 on the second substrate 5 is brought to move on the optical axis when the temperature changes. In addition to the different initial setting modes described in the above-mentioned principle analysis, the difference between the structures shown in the above-mentioned FIG. 3 and FIG. 5 is that the integration effect of the structure shown in FIG. 3 is better than that of the structure shown in FIG. 5, while the heat dissipation effect of the structure shown in FIG. 5 is better than that of the structure shown in FIG. 3. Furthermore, the elongation response speed of the structure shown in FIG. 3 along with the temperature change of the laser will be better than that of the structure shown in FIG. 5 (of course, the comparison is made on the basis that the second substrates of the both structures are composed of the same material). It may be configured which mode is used according to the requirements of specific application scene.

Figure 6:
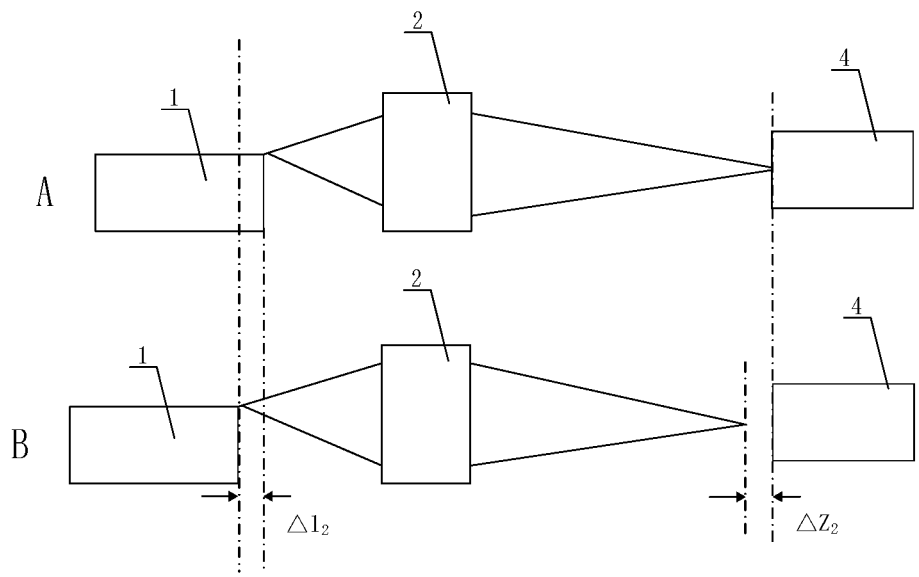
FIG. 6 is a cross-sectional view of another corresponding device, in which the lens is offset in a direction far away from the laser, according to an embodiment of the present disclosure.

As shown in FIG. 6, it is another optional structural form provided by the embodiment of the present disclosure, wherein the first substrate 6 is set with a fixing groove (as shown by the dashed box in FIG. 6), in which the second substrate 5 is embedded. One end of the second substrate 5 is fixed at the bottom of the fixing groove, and the other end of the second substrate 5 located outside the fixing groove is in a freely telescopic state, so that the optical fiber coupling port 4 on the second substrate 5 can be driven to move on the optical axis when the temperature changes. The difference between the structure shown in FIG. 6 and the structure shown in the above-mentioned FIG. 3 or FIG. 5 is that the through-holes are used in FIGS. 3 and 5, while the fixing groove is used in FIG. 6. Relatively speaking, the single-sided fixing effect (or can be understood as the single-sided elongation effect of the second substrate) of the fixing groove is better. However, the mode of using the fixing groove will increase the thickness of the wall of the first substrate in the area of the fixing groove (as shown by the m-labeled spacing in FIG. 6), which affects the whole volume.

As shown in the cross-sectional view of FIG. 3, in a specific implementation, the second substrate adopts a cylindrical shape, and one end thereof far away from the laser is fixed on the first substrate, while the end close to the laser is suspended. The output port is a plug-in core with a tail fiber, which is fixed on the suspended end of the second substrate with soft glue. By using the tail fiber and the soft glue, the optical path structure may be prevented from being damaged when the second substrate expands and contracts. The laser and the output port are fixed, and the lens is adjusted. When the maximum coupling efficiency is obtained by the optical path, the lens is offset a few microns to be far away from the laser. At this time, the emission optical power will be slightly reduced, but the emission optical power has a more stable temperature property.

The principle explanation thereof is shown in FIG. 4 (with reference to FIG. 1). Figure A in FIG. 4 shows a state in which the coupling efficiency is maximum, and at this time, the output port is located exactly at an image point of the laser. After the lens is moved a few microns away from the laser, as shown in figure B in FIG. 4, according to the imaging principle, the image point of the laser will be closer to the chip. The distance between the receiving port and the optimal receiving point is as follows:

$$\Delta Z = (\alpha-1)\Delta l_1,$$

where $\Delta l_1$ is a lens offsetting distance, and $\alpha$ is an axial magnification.

When the temperature changes relative to the initial temperature, the second substrate would expand when heated and contract when cooled, which drives the receiving port to slightly move. After considering the effects of thermal expansion and cold contraction, the distance between the receiving port and the optimal receiving point is as follows:

$$\Delta Z = (\alpha-1)\Delta l_1 - \varepsilon d(T_1 - T_0),$$

where $\varepsilon$ is the thermal expansion coefficient of the second substrate material, d is the length of the freely telescopic portion of the second substrate, and $T_0$ is the initial temperature of the emission optical power stabilization assembly. When the temperature increases, $\Delta Z$ decreases, and the coupling efficiency increases; when the temperature decreases, $\Delta Z$ increases, and the coupling efficiency decreases; and when $\Delta Z=0$, the recovery of the optimal coupling effect at the highest working temperature set by the present disclosure is obtained (i.e. the coupling deviation set in the initial state is compensated).

Of course, in the present embodiment, after the maximum coupling efficiency is obtained by the optical path, the lens can also be offset a few microns to make it still further closer to the laser. At this time, the image point of the laser will be still further away from the chip. The corresponding device structure is shown in FIG. 4, wherein one end of the second substrate close to the laser is fixed on the first substrate, and one end thereof far away from the laser is suspended, such that when the temperature increases, the second substrate expands, the receiving port is still further far away from the chip, and the coupling efficiency increases; when the temperature decreases, the second substrate contracts, the receiving port is still further closer to the chip, and the coupling efficiency further decreases.

Embodiment 3

Figure 7:
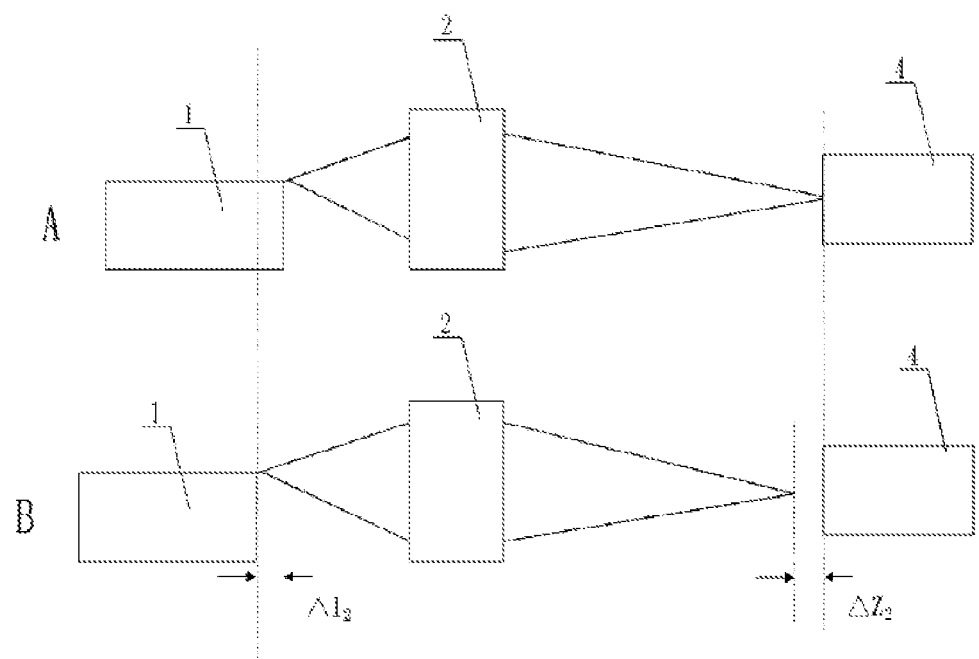
FIG. 7 is a schematic diagram of the optical path, in which the laser is offset in a direction back to the lens, in mode 1 provided by an embodiment of the present disclosure.

Embodiment 2 provides mode 1 introduced in embodiment 1, which specifically forms a structural relationship of the initial state (compared with the preset deviation value with respect to the optimal coupling distance from the optimal coupling point) by setting the position of the lens 2. However, in the specific implementation, the objects that are fixed during processing also include the laser and the optical fiber coupling port, therefore, in addition to implementing mode 1 of embodiment 1 by setting the position of the lens 2 proposed in embodiment 2, embodiment 3 of the present disclosure will further explain how to realize the initial state in mode 1 through adjusting the laser 1. The basic structure may be realized with reference to FIG. 3 and FIG. 5. In the following content, FIG. 7 is referred to introduce how to arrange an initial distance between the laser and the lens to form a preset deviation value with respect to the optimal coupling distance from the optimal coupling point (in this embodiment of the present disclosure, it is specifically expressed as a second specified distance $\Delta l_2$).

The laser 1 and the lens 2 are on the first substrate 6, and the optical fiber coupling port 4 is on the second substrate 5, wherein the length of the second substrate 5 is elongated along with the increase of temperature.

An initial position on the first substrate 6 where the laser 1 is located is offset on the optical axis relative to an optimal coupling point for the coupling of the laser 1 with the lens 2 and the optical fiber coupling port 4 towards the side where the lens 2 is located by a second specified distance $\Delta l_2$ (applicable to the structure shown in FIG. 5) or is offset back to the side where the lens is located by the second specified distance $\Delta l_2$ (applicable to the structure shown in FIG. 3).

One end of the second substrate 5 is tightly connected with the first substrate, which is used for the length of the other end of the second substrate 5 can be elongated along with the increase of temperature when the outside temperature increases, so that the second substrate drives the optical fiber coupling port to move a telescopic offset $\Delta Z_2$ to compensate the second specified distance $\Delta l_2$ when the emission optical power stabilization assembly is close to the maximum working temperature.

Figure A in FIG. 7 is a relationship diagram of the optimal coupling position between the laser 1, the lens 2 and the optical fiber coupling port 4, and figure B in FIG. 7 is a schematic diagram of offset adjustment made by taking the structure shown in FIG. 3 as an example (if it is made by taking the structure shown in FIG. 5 as an example, then it is only necessary to adjust the laser 1 in figure B in FIG. 7 towards the right side by $l_2$). During specific using, when the working temperature of the emission optical power stabilizing assembly is close to the maximum temperature, the second substrate 5 will drive the optical fiber coupling port 4 to complete the compensation offset of $\Delta Z_2$ shown in FIG. 7. A setting of the second specified distance $\Delta l_2$ specifically includes:

determining a maximum working temperature $T_1$ of the emission optical power stabilization assembly during actual working, and $T_1$ being larger than $T_0$, and then according to a following relational expression:

$$\Delta l_2 = \frac{\varepsilon d(T_1 - T_0)}{\alpha},$$

calculating the second specified distance 12, wherein $\Delta Z_2 = \varepsilon d(T_1 - T_0)$, where $\varepsilon$ is the thermal expansion coefficient of the second substrate material, d is the length of the freely telescopic portion of the second substrate, $T_0$ is the initial temperature of the emission optical power stabilization assembly, and $\alpha$ is the axial magnification.

The implementation principle in embodiment 3 is the same as that in embodiment 2. Therefore, the extended implementation in the related embodiment 2 is also applicable to the above-mentioned solution which takes adjusting the position of the laser 2 as an example, and details are not described herein again.

Embodiment 4

Embodiment 2 provides mode 1 introduced in embodiment 1, which specifically forms the structural relationship of the initial state (compared with the preset deviation value with respect to the optimal coupling distance from the optimal coupling point) by setting the position of the lens 2. Embodiment 3 provides mode 1 introduced in embodiment 1, which specifically forms a structural relationship of the initial state (compared with the preset deviation value with respect to the optimal coupling distance deviation from the optimal coupling point) by setting the position of the laser 1. In the specific implementation, since the objects that are fixed during processing also include the optical fiber coupling port, in addition to the implementation of mode 1 of embodiment 1 by setting the position of the lens 2 proposed in embodiment 2, and by setting the position of the laser 1 proposed in embodiment 3, embodiment 4 of the present disclosure will further explain how to realize the initial state in mode 1 through adjusting the optical fiber coupling port 4. The basic structure may be realized with reference to FIG. 3 and FIG. 5. In the following content, the initial distance between the laser and the lens will be specifically described through FIG. 8, thereby forming a preset value deviated from an optimal coupling distance from an optimal coupling point.

The laser 1 and the lens 2 are on the first substrate 6, and the optical fiber coupling port 4 is on the second substrate 5, wherein the length of the second substrate 5 is elongated along with the increase of temperature.

An initial position on the second substrate 5 where the optical fiber coupling port 4 is located is offset on the optical axis relative to an optimal coupling point for the coupling of the laser 1 with the lens 2 and the optical fiber coupling port 4 towards the side where the lens 2 is located by a third specified distance $\Delta l_3$ (applicable to the structure shown in FIG. 5) or is offset back to the side where the lens 2 is located by the third specified distance $\Delta l_3$ (applicable to the structure shown in FIG. 3).

One end of the second substrate 5 is tightly connected with the first substrate 6, which is used for the length of the other end of the second substrate 5 can be elongated along with the increase of temperature when the outside temperature increases, so that the second substrate 5 drives the optical fiber coupling port 4 to move a telescopic offset $\Delta Z_3$ to compensate the third specified distance $\Delta l_3$ when the emission optical power stabilization assembly is close to the maximum working temperature.

Figure 8:
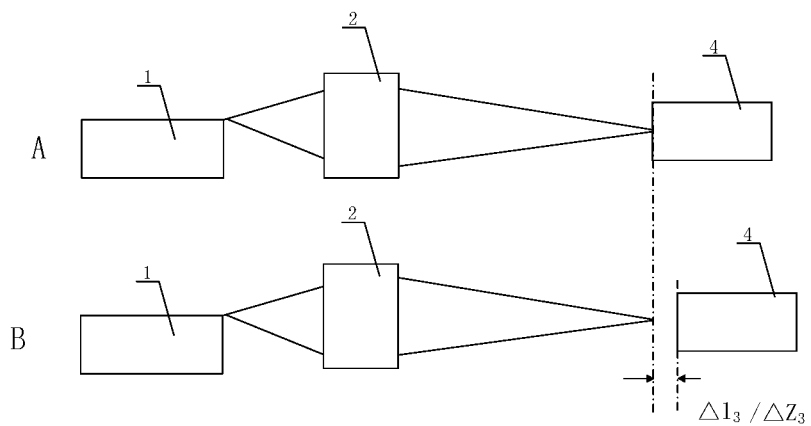
FIG. 8 is a schematic diagram of the optical path, in which the optical fiber coupling interface is offset in a direction back to the lens, in mode 1 provided by an embodiment of the present disclosure.

Figure A in FIG. 8 is a relationship diagram of the optimal coupling position between the laser 1, the lens 2 and the optical fiber coupling port 4, and figure B in FIG. 8 is a schematic diagram of offset adjustment made by taking the structure shown in FIG. 3 as an example (if it is made by taking the structure shown in FIG. 5 as an example, then it is further necessary to adjust the laser 1 in figure B in FIG. 8 towards the right side by $\Delta l_3$). In the embodiment of the present disclosure, the calculated third specified distance $\Delta l_3$ is the compensation distance to be completed subsequently by the optical fiber coupling port driven by the second substrate 5 at the highest working temperature, i.e. $\Delta Z_3 = \Delta l_3$ in the embodiment of the present disclosure.

A setting of the third specified distance $\Delta l_3$ specifically includes:

determining the maximum working temperature $T_1$ of the emission optical power stabilization assembly during actual working, and $T_1$ being larger than $T_0$, and then according to a following relational expression:

$$\Delta l_3 = \varepsilon d(T_1 - T_0);$$

calculating the third specified distance $\Delta l_3$, wherein $\Delta Z_3 = \varepsilon d(T_1 - T_0)$, where $\varepsilon$ is the thermal expansion coefficient of the second substrate material, d is the length of the freely telescopic portion of the second substrate, $T_0$ is the initial temperature of the emission optical power stabilization assembly, and $\alpha$ is the axial magnification.

The implementation principle in embodiment 4 is the same as that in embodiment 2. Therefore, the extended implementation in the related embodiment 2 is also applicable to the above-mentioned solution which takes the adjustment of the position of the laser 2 as an example, and details are not described herein again.

By means of the calculation formula of the above-mentioned third specified distance $\Delta l_3$, it can be seen that there is one of the most concise and effective setting modes in mode 1, mode 2 and mode 3 provided in the embodiments of the present disclosure, that is, the object which is to be initially adjusted and the object whose position changes along with the elongation of the second substrate are set as the same object, so that a simplified calculation formula can be obtained, thus the parameter setting accuracy is improved. Similarly, it also has mode 2 introduced in subsequent embodiment 5 and mode 3 introduced in embodiment 9.

Embodiment 5

Figure 9:
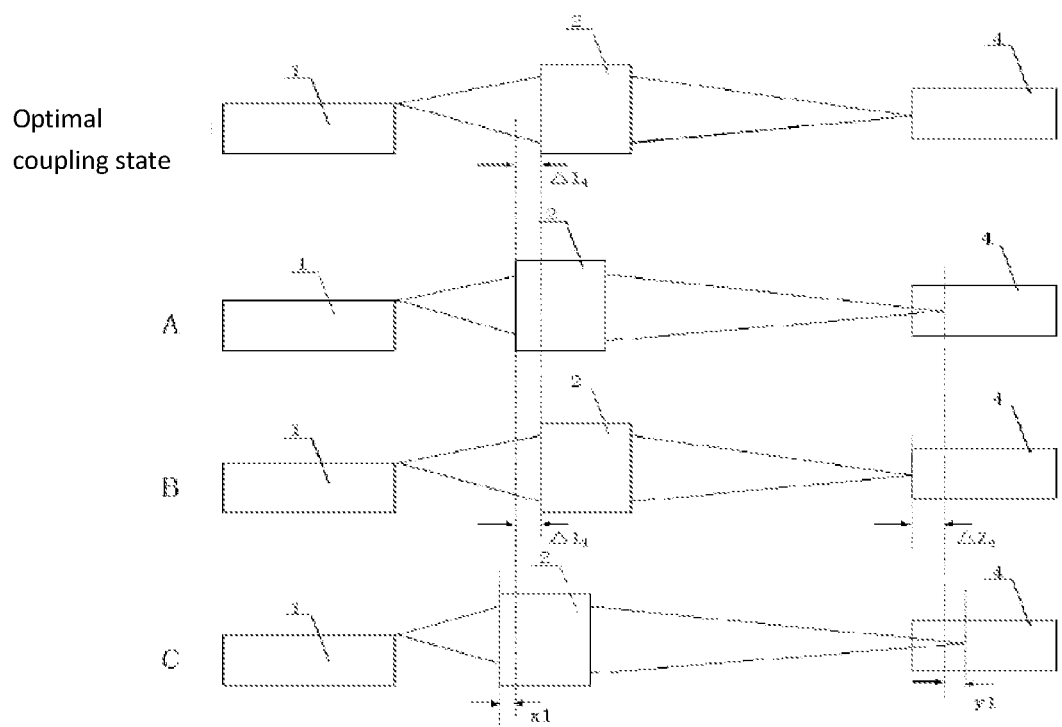
FIG. 9 is a schematic structural diagram of the device in mode 2 provided by an embodiment of the present disclosure.
Figure 11:
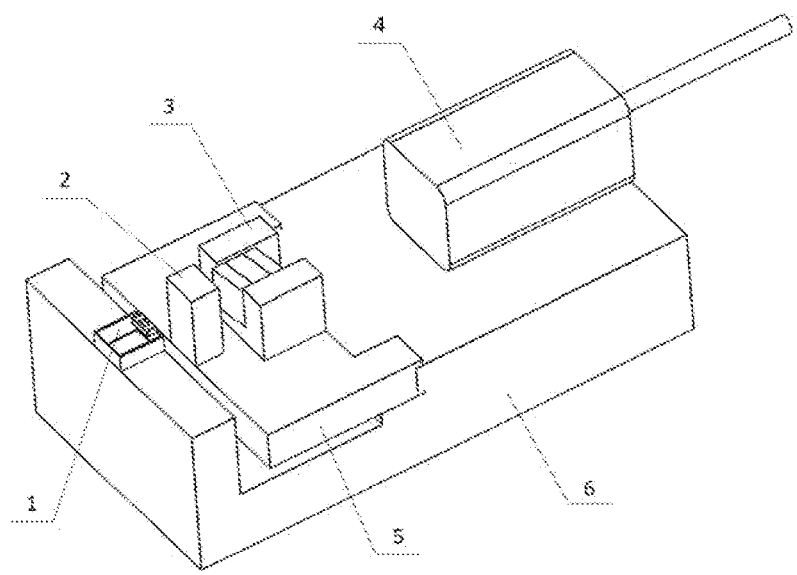
FIG. 11 is a schematic structural diagram of another device in mode 2 provided by an embodiment of the present disclosure.

Embodiment 5 of the present disclosure is an example for describing in detail mode 2 in embodiment 1, and the difference from the mode 1 is that the object set on the second substrate 5 is the lens 2, rather than the optical fiber coupling port 4. As shown in FIG. 9 and FIG. 11, in this embodiment of the present disclosure, the optical-path-displacement-compensation-based emission optical power stabilization assembly also includes a laser 1, a lens 2, and an optical fiber coupling port 4.

The laser 1 and the optical fiber coupling port 4 are located on the first substrate 6, and the lens 2 is located on the second substrate 5, wherein the length of the second substrate 5 changes along with the change of the temperature (for example, it elongates as the temperature increases, and shortens as the temperature decreases). In the embodiment of the present disclosure, it is preferable to pay attention to a scene where the working temperature increases.

When provided on the second substrate 5, the lens 2 is offset on the optical axis relative to an optimal coupling point for the coupling of the lens 2 with the laser 1 and the optical fiber coupling port 4 towards the side where the optical fiber coupling port 4 is located by a fourth specified distance $\Delta l_4$ or is offset towards the side where the laser 1 is located by the fourth specified distance $\Delta l_4$.

One end of the second substrate 5 is tightly connected with the first substrate 6, which is used for the length of the other end of the second substrate 5 can be elongated along with the increase of temperature when the outside temperature increases, so that the second substrate 5 drives the lens 2 to move a telescopic offset $\Delta Z_4$ to compensate the fourth specified distance $\Delta l_4$ when the emission optical power stabilization assembly is close to the maximum working temperature.

Since the present embodiment is a technical solution on the basis of the same inventive concept as embodiment 2, the corresponding principle description and the structural detail expansion in embodiment 2 are also applicable to the present embodiment, and details are not described herein again.

Figure 10:
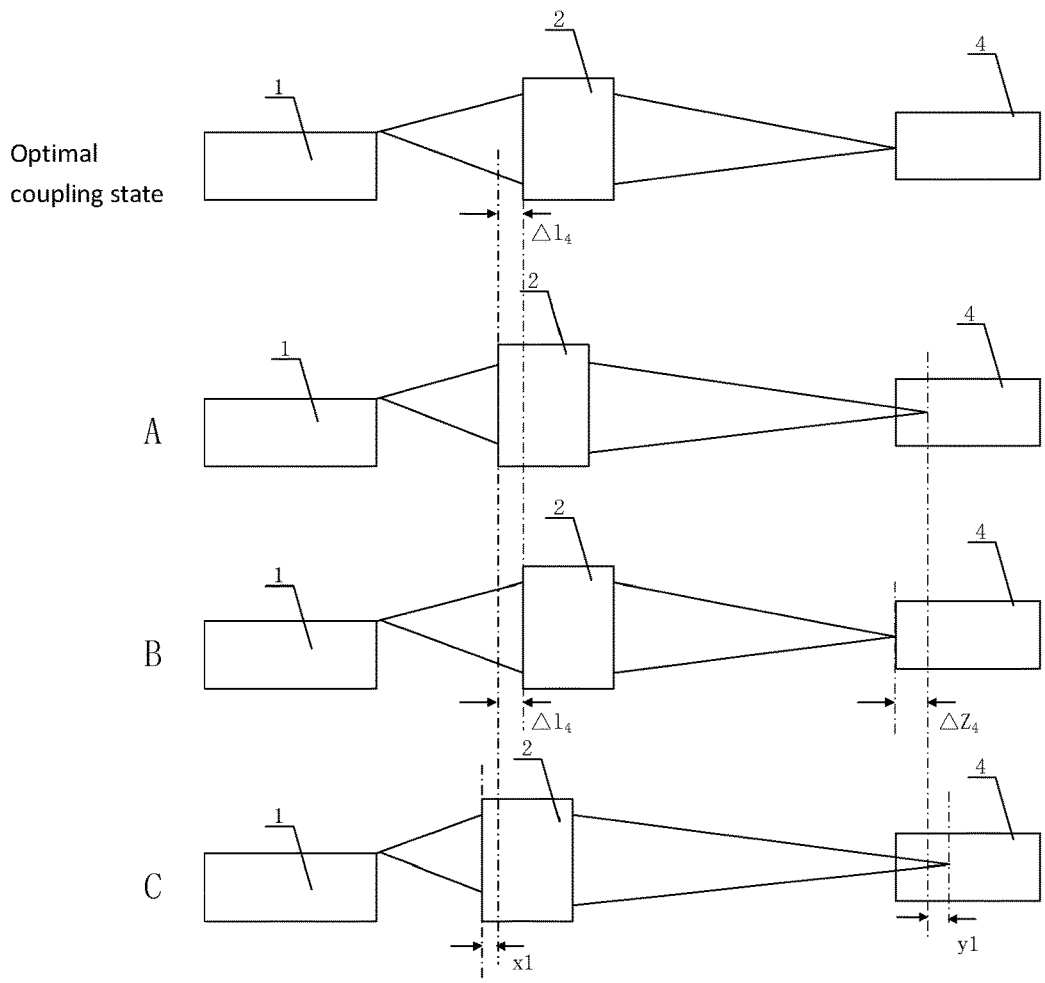
FIG. 10 is a schematic diagram of the optical path suitable for FIG. 9, in which the lens is offset in a direction far away from the laser, provided by an embodiment of the present disclosure.

It should be emphasized that in the structure of FIG. 9, one side of the second substrate 5 close to the laser 1 is embedded in the first substrate 6, and one side of the second substrate 5 far away from the laser 1 is in a free state. When the lens 2 is set during processing, it is deliberately offset by $\Delta l_4$ in the direction close to the laser 1 (as shown in figure A in FIG. 10). Then when the specific working temperature increases, the second substrate 5 expands (elongates) to drive the lens 2 to offset in the direction far away from the laser 1, and the coupling efficiency increases (as shown in figure B in FIG. 10). When the elongation reaches $\Delta Z_4=\Delta l_4$, it will return to the optimal coupling state. When the temperature decreases (the emission optical power of the laser is usually increases along with the decrease of the working temperature), the second substrate 5 contracts to drive the lens 2 to offset in the direction close to the laser 1, and the coupling efficiency decreases (as shown in figure C in FIG. 10, the lens 2 is further closer to the laser by a distance of x1, and the corresponding offset of the focus from the optimal coupling point is further increased by y1, which is used for compensating the influence of the increase of the optical power of the laser 1 caused by the cooling), thereby showing that the optical power obtained on the side where the fiber coupling port 4 is located changes within a preset range.

In the present embodiment of the present disclosure, a setting of the fourth designated distance $\Delta l_4$ specifically includes:

determining the maximum working temperature $T_1$ of the emission optical power stabilization assembly during actual working, and $T_1$ being larger than $T_0$, and then according to the following relational expression:

$$\Delta l_4=\varepsilon d(T_1-T_0),$$

calculating the fourth specified distance $\Delta l_4$, wherein $\Delta_4=\varepsilon d(T_1-T_0)$, where $\varepsilon$ is the thermal expansion coefficient of the second substrate material, d is the length of the freely telescopic portion of the second substrate, and $T_0$ is the initial temperature of the emission optical power stabilization assembly.

In another device structure, as shown in FIG. 11, one side of the second substrate 5 close to the laser 1 is in a free state, and one side of the second substrate 5 far away from the laser 1 is embedded in the first substrate 6. After the lens 2 is offset in the direction far away from the laser 1, when the temperature increases, the second substrate expands to drive the lens 2 to offset in the direction close to the laser 1, and the coupling efficiency is increased; when the temperature decreases, the second substrate contracts to drive the lens 2 to offset in the direction far away from the laser 1, and the coupling efficiency is decreased.

Compared with the above-mentioned embodiment 5, this embodiment of the present disclosure has the advantages reflecting that the temperature response speed thereof will be better, because the position where the second substrate is provided with the lens 2 can be closer to the laser 1, compared with the position where the second substrate is provided with the optical fiber coupling port 4. Further, when the structure shown in FIG. 9 implementing the present embodiment compares with the structure shown in FIG. 11 implementing the present embodiment, the response efficiency of FIG. 9 is also better than the response efficiency of FIG. 10, in particular in a case where the first substrate is made of the metal material having a better effect of conducting heat, and since the fixed port of the second substrate in FIG. 9 is set on the first substrate below the laser, the temperature of the laser 1 can be obtained faster.

Embodiment 6

In embodiment 5, mode 2 introduced in the embodiment 1 is provided, wherein a structural relationship of the initial state (there is the preset deviation value relative to the optimal coupling distance from the optimal coupling point) is formed specifically by setting the position of the lens 2. In the specific implementation process, since the objects that are fixed during processing also include the laser and the optical fiber coupling port, in addition to implementing mode 2 of embodiment 1 by setting the position of the lens 2 proposed in embodiment 5, embodiment 6 of the present disclosure will further explain how to realize the initial state in mode 2 by adjusting the laser 1. The basic structure may be realized with reference to FIG. 9 and FIG. 11. In the following content, how to arrange an initial distance between the laser and the lens will be specifically described through FIG. 12, thereby forming a preset value deviated from an optimal coupling distance of an optimal coupling point.

The laser 1 and the lens 2 are on the first substrate 6, and the optical fiber coupling port 4 is on the second substrate 5, wherein the length of the second substrate 5 is elongated along with the increase of temperature.

An initial position on the first substrate 6 where the laser 1 is located is offset on the optical axis relative to an optimal coupling point for the coupling of the laser 1 with the lens 2 and the optical fiber coupling port 4 towards the side where the lens 2 is located by a fifth specified distance $\Delta l_5$ (applicable to the structure shown in FIG. 9) or is offset back to the side where the lens is located by the fifth specified distance $\Delta l_5$ (applicable to the structure shown in FIG. 11).

One end of the second substrate 5 is tightly connected with the first substrate 6, which is used for the length of the other end of the second substrate 5 can be elongated along with the increase of temperature when the outside temperature increases, so that the second substrate 5 drives the lens 2 to offset a telescopic offset $\Delta Z_5$ to compensate the coupling deviation caused by the fifth specified distance $\Delta l_5$ when the emission optical power stabilization assembly is close to the maximum working temperature.

Figure 12:
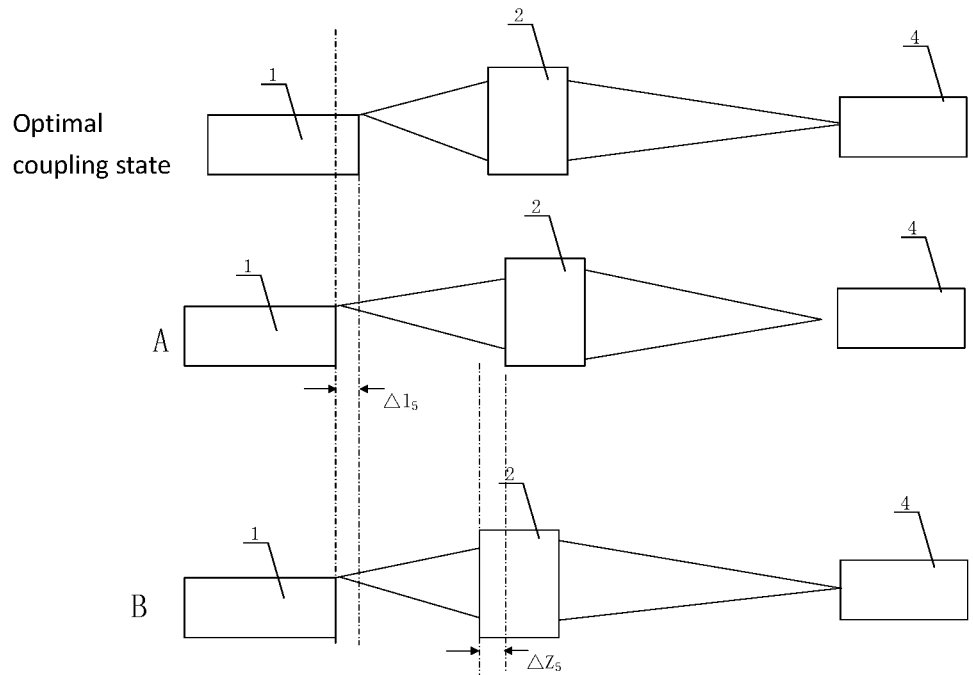
FIG. 12 is a schematic diagram of the optical path, in which the laser is offset in a direction far away from the lens, in mode 2 provided by an embodiment of the present disclosure.

FIG. 12 is a relationship diagram of the optimal coupling position between the laser 1, the lens 2 and the optical fiber coupling port 4, and figure A in FIG. 12 is a schematic diagram of offset adjustment made by the structure shown in FIG. 11 as an example (if it is made by the structure shown in FIG. 9 as an example, then it is necessary to only adjust the laser 1 in figure A in FIG. 12 towards the right side by $\Delta l_5$). A setting of the fifth designated distance $\Delta l_5$ specifically includes:

determining a maximum working temperature $T_1$ of the emission optical power stabilization assembly during actual working, and $T_1$ is larger than $T_0$, and then according to a following relational expression:

$$\Delta l_5 = \frac{(\alpha-1)\varepsilon d(T_1 - T_0)}{\alpha},$$

calculating the fifth specified distance $\Delta l_5$, wherein $\Delta Z_5 = \varepsilon d(T_1 - T_0)$, where $\varepsilon$ is the thermal expansion coefficient of the second substrate material, d is the length of the freely telescopic portion of the second substrate, $T_0$ is the initial temperature of the emission optical power stabilization assembly, and $\alpha$ is the axial magnification.

The implementation principle in embodiment 6 is the same as that in embodiment 2. Therefore, the extended implementation content in the related embodiment 2 is also applicable to the above-mentioned solution implemented by adjusting the position of the laser 2 as an example, and details are not described herein again.

In the modes implemented by different means (specifically refers to the difference in the objects adjusted for realizing the initial coupling deviation) listed in the various embodiments of the present disclosure, the means of adjusting the laser at the initial time is not the most optimal selection among the various modes and means for the position of the laser is set in the prior art is strictly limited, and the reason thereof is that the heat dissipation standard of laser is relatively strict. Although the adjustment range of the initial position involved in the present disclosure is not large, and has little effect on the heat dissipation of the laser in the prior art, the means of adjusting the initial position of the laser can be used as an alternative solution compared with the feasibility of other means.

Embodiment 7

In embodiment 5, mode 2 introduced in the embodiment 1 is provided, wherein a structural relationship of the initial state (compared with the preset deviation value of the optimal coupling distance of the optimal coupling point) is specifically formed by setting the position of the lens 2. In embodiment 6, mode 2 introduced in the embodiment 1 is provided, wherein a structural relationship of the initial state (compared with the preset deviation value of the optimal coupling distance of the optimal coupling point) is specifically formed by setting the position of the laser 1. Embodiment 7 of the present disclosure will further explain how to realize the initial state in mode 2 by adjusting the optical fiber coupling port 4. The basic structure may be realized with reference to FIG. 9 and FIG. 11. In the following content, how to arrange an initial distance between the laser and the lens will be specifically described through FIG. 13, thereby forming a preset value deviated from an optimal coupling distance of the optimal coupling point.

The laser 1 and the lens 2 are on the first substrate 6, and the optical fiber coupling port 4 is on the second substrate 5, wherein the length of the second substrate 5 is elongated along with the increase of temperature.

An initial position of the optical fiber coupling port 4 on the first substrate 6 is offset on the optical axis relative to an optimal coupling point for the coupling of the laser 1 with the lens 2 and the optical fiber coupling port 4 towards a side where the lens 2 is located by a sixth specified distance $\Delta l_6$ (applicable to the structure shown in FIG. 9) or is offset back to the side of the lens by the sixth specified distance $\Delta l_6$ (applicable to the structure shown in FIG. 11).

One end of the second substrate 5 is tightly connected with the first substrate 6, which is used for the length of the other end of the second substrate 5 can be elongated along with the increase of temperature when the outside temperature increases, so that the second substrate 5 drives the lens 2 to offset the telescopic offset $\Delta Z_6$ to compensate the coupling deviation caused by the sixth specified distance $\Delta l_6$ when the emission optical power stabilization assembly is close to the maximum working temperature.

Figure 13:
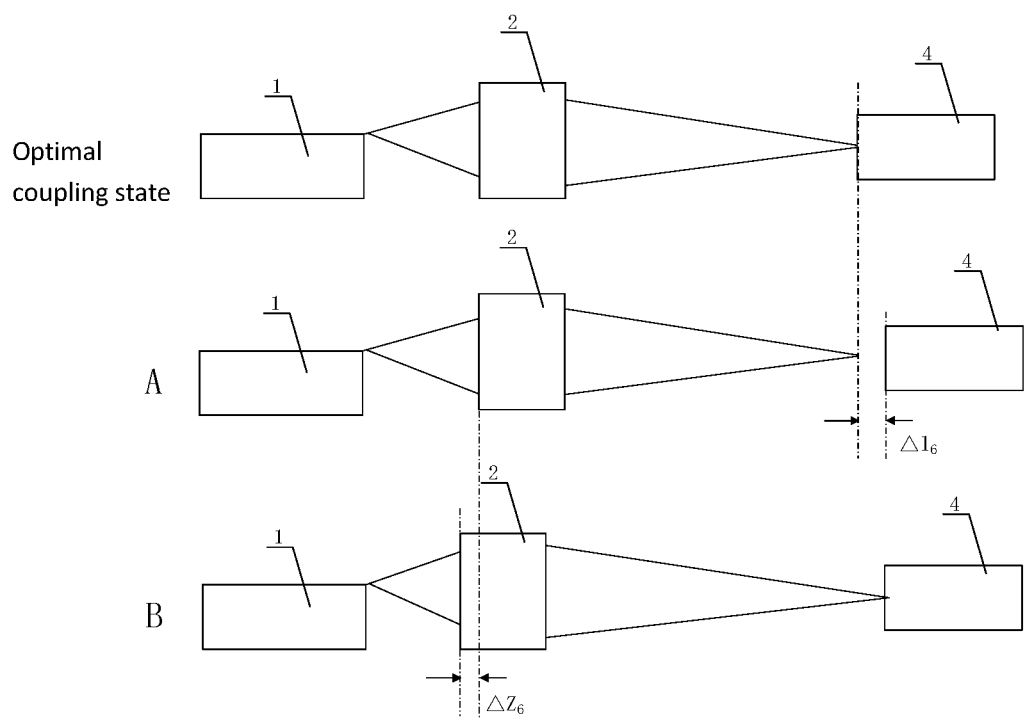
FIG. 13 is a schematic diagram of the optical path, in which the optical fiber coupling port is offset in a direction far away from the lens, in mode 2 provided by an embodiment of the present disclosure.

FIG. 13 is a relationship diagram of the optimal coupling position between the laser 1, the lens 2 and the optical fiber coupling port 4, and figure A in FIG. 13 is a schematic diagram of offset adjustment to the structure shown in FIG. 11 which is taken as an example (if the structure shown in FIG. 9 is taken as an example, then it is necessary to only adjust the laser 1 in figure A in FIG. 13 towards the right side by $\Delta l_6$). A setting of the sixth designated distance $\Delta Z_6$ specifically includes:

determining a maximum working temperature $T_1$ of the emission optical power stabilization assembly during actual working, and $T_1$ is larger than $T_0$, and then according to a following relational expression:

$$\Delta l_6 = (\alpha-1)\varepsilon d(T_1 - T_0);$$

calculating the sixth specified distance $\Delta l_6$, wherein $\Delta Z_6 = \varepsilon d(T_1 - T_0)$, where $\varepsilon$ is the thermal expansion coefficient of the second substrate material, d is the length of the freely telescopic portion of the second substrate, $T_0$ is the initial temperature of the emission optical power stabilization assembly, and $\alpha$ is the axial magnification.

The implementation principle is the same as that in embodiment 2, therefore, the extended implementation content in the related embodiment 2 is also applicable to the above-mentioned solution implemented which takes adjusting the position of the laser 2 as an example, and details are not described herein again.

Embodiment 8

Figure 14:
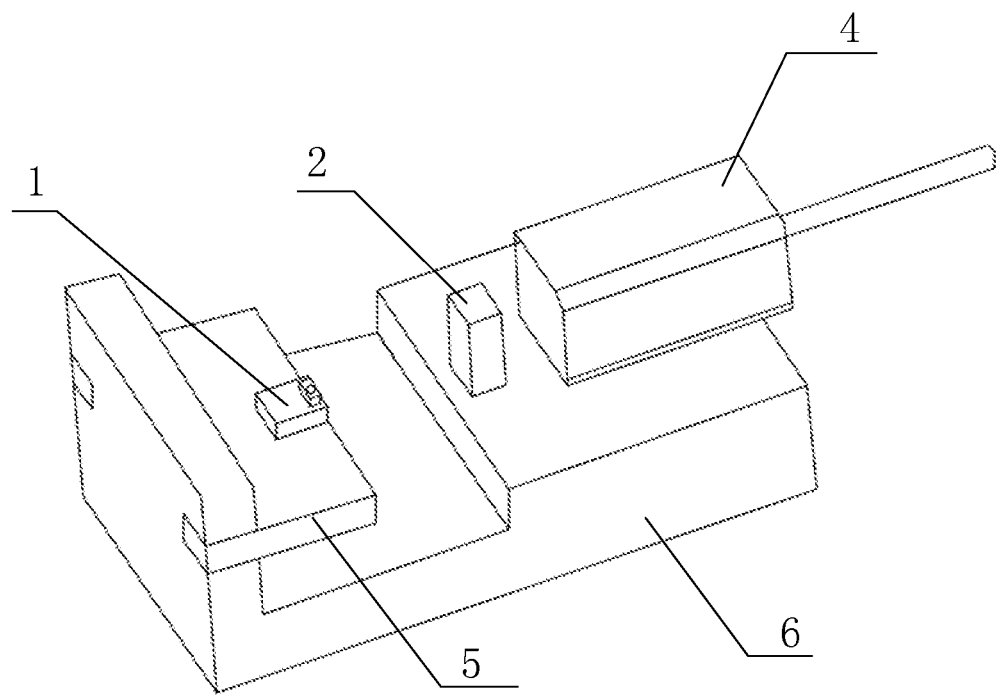
FIG. 14 is a schematic structural diagram of the device in mode 3 provided by an embodiment of the present disclosure.

Embodiment 8 of the present disclosure is an example describing in detail mode 3 in embodiment 1, and the difference from mode 1 is that the object set on the second substrate 5 is the laser 1, rather than the optical fiber coupling port 4. As shown in FIG. 14, in the present embodiment, the optical-path-displacement-compensation-based emission optical power stabilization assembly also includes a laser 1, a lens 2, and an optical fiber coupling port 4.

The lens 2 and the optical fiber coupling port 4 are located on the first substrate 6, and the laser 1 is located on the second substrate 5, wherein the length of the second substrate 5 changes along with the change of temperature (for example, it elongates as the temperature increases, and it shortens as the temperature decreases). In the present embodiment, it is preferable to pay attention to a scene where the working temperature increases.

When the lens 2 is set on the first substrate 6, it is offset on the optical axis relative to an optimal coupling point for the coupling of the lens 2 with the laser 1 and the optical fiber coupling port 4 towards the optical fiber coupling port 4 by a seventh specified distance $\Delta l_7$ (this pattern corresponds to the implementation mode in FIG. 14) or is offset towards the side where the laser 1 is located by the seventh specified distance $\Delta l_7$ (in the present embodiment of the present disclosure, the corresponding implementation structure diagram is not separately provided. However, the structure shown in FIG. 14 can be derived in accordance with the transformation mode between FIG. 11 and FIG. 9, which will not be repeated here).

One end of the second substrate 5 is tightly connected with the first substrate 6, which is used for the length of the other end of the second substrate 5 can be elongated along with the increase of temperature when the outside temperature increases, so that the second substrate 5 drives the laser 1 to offset a telescopic offset $\Delta Z_7$ to compensate the seventh specified distance $\Delta l_7$ when the emission optical power stabilization assembly is close to the maximum working temperature.

Since the present embodiment is a technical solution designed on the basis of the same inventive concept as that in embodiment 2, the corresponding principle description and the structural detail expansion in embodiment 2 are also applicable to the present embodiment of the present disclosure, and details are not described herein again.

Figure 15:
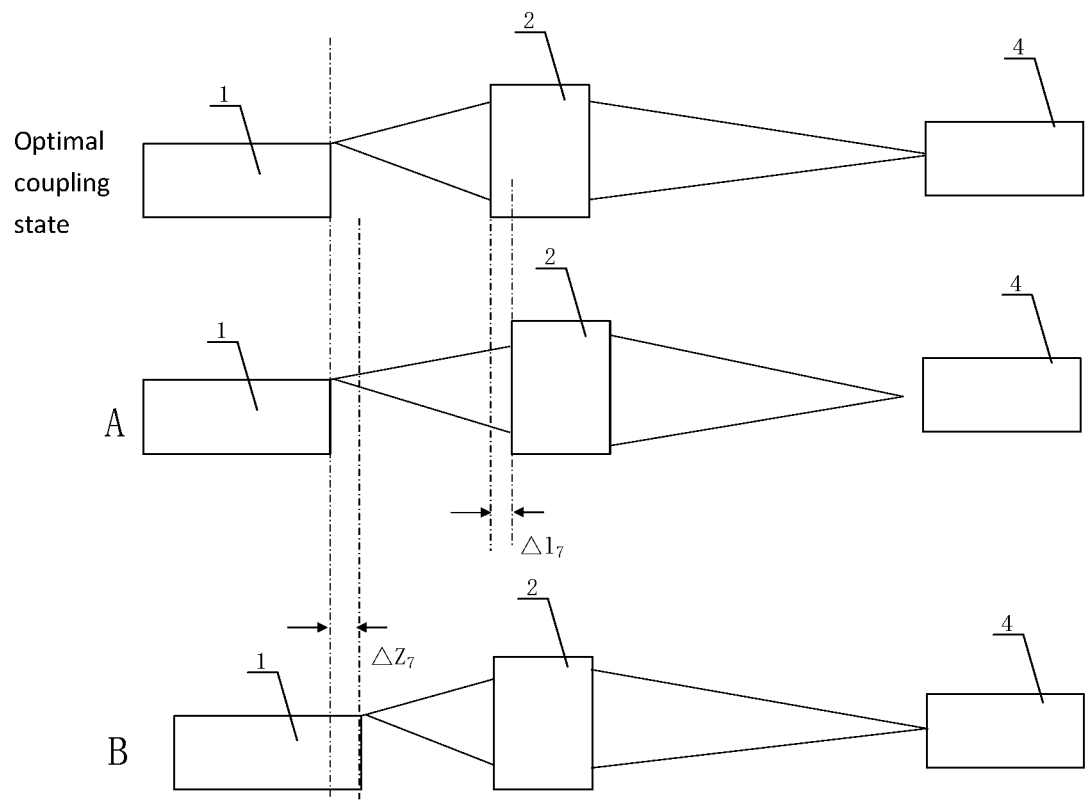
FIG. 15 is a schematic diagram of an optical path, in which the lens is offset in a direction far away from the laser, in mode 3 according to an embodiment of the present disclosure.

It should be emphasized that in the structure of FIG. 14, one side of the second substrate 5 close to the laser 1 is embedded in the first substrate 6, and the other side of the second substrate 5 far away from the laser 1 is in a free state. When the lens 2 is set during processing, it is deliberately offset by $\Delta l_7$ in the direction close to the fiber coupling port 4 (as shown in figure A in FIG. 15); then when the specific working temperature increases, the second substrate 5 expands (elongates) to drive the lens 2 to offset in the direction far away from the laser 1, and the coupling efficiency is increased (as shown in figure B in FIG. 10). When the telescopic offset $\Delta Z_7$ reaches $\epsilon d(T_1-T_0)$, it will return to the optimal coupling state.

In the present embodiment of the present disclosure, a setting of the seventh designated distance $\Delta l_7$ specifically includes:

determining a maximum working temperature $T_1$ of the emission optical power stabilization assembly during actual working, and $T_1$ is larger than $T_0$, and then according to a following relational expression:

$$\Delta l_7 = \frac{\alpha \epsilon d(T_1 - T_0)}{\alpha - 1};$$

calculating the seventh specified distance $\Delta l_7$, wherein $\Delta Z_7 = \epsilon d(T_1-T_0)$, where $\epsilon$ is the thermal expansion coefficient of the second substrate material, d is the length of the freely telescopic portion of the second substrate, $T_0$ is the initial temperature of the emission optical power stabilization assembly, and $\alpha$ is the axial magnification.

Embodiment 9

Embodiment 9 of the present disclosure is an example describing in detail mode 3 in embodiment 1, and different from embodiment 8, what is used in the this embodiment of the present disclosure is that the coupling deviation in the corresponding initial state is realized by adjusting the initial position of the laser 1 during processing. Similarly, referring to the structure shown in FIG. 14, in the present embodiment, the optical-path-displacement-compensation-based emission optical power stabilization assembly also includes a laser 1, a lens 2, and an optical fiber coupling port 4.

The lens 2 and the optical fiber coupling port 4 are located on the first substrate 6, and the laser 1 is located on the second substrate 5, wherein the length of the second substrate 5 changes along with the change of temperature (for example, it elongates as the temperature increases, and it shortens as the temperature decreases). In this embodiment of the present disclosure, it is preferable to pay attention to a scene where the working temperature increases.

When the lens 1 is set on the second substrate 5, it is offset back to the lens 2 by an eighth specified distance $\Delta l_8$ (this pattern corresponds to the implementation mode in FIG. 14) or is offset face to the lens 2 by the eighth specified distance $\Delta l_8$ on the optical axis relative to an optimal coupling point with the laser 1 and the optical fiber coupling port 4 (in the present embodiment, the corresponding implementation structure diagram is not separately provided. However, the structure shown in FIG. 14 can be derived on the basis of the transformation mode between FIG. 11 and FIG. 9, which will not be repeated here).

One end of the second substrate 5 is tightly connected with the first substrate 6, which is used for the length of the other end of the second substrate 5 can be elongated along with the increase of temperature when the outside temperature increases, so that the second substrate 5 drives the laser 1 to offset a telescopic offset $\Delta Z_8$ to compensate the eighth specified distance $\Delta l_8$ when the emission optical power stabilization assembly is close to the maximum working temperature.

Since the present embodiment is a technical solution designed on the basis of the same inventive concept as that in embodiment 2, the corresponding principle description and the structural detail expansion in embodiment 2 are also applicable to the present embodiment, and details are not described herein again.

Figure 16:
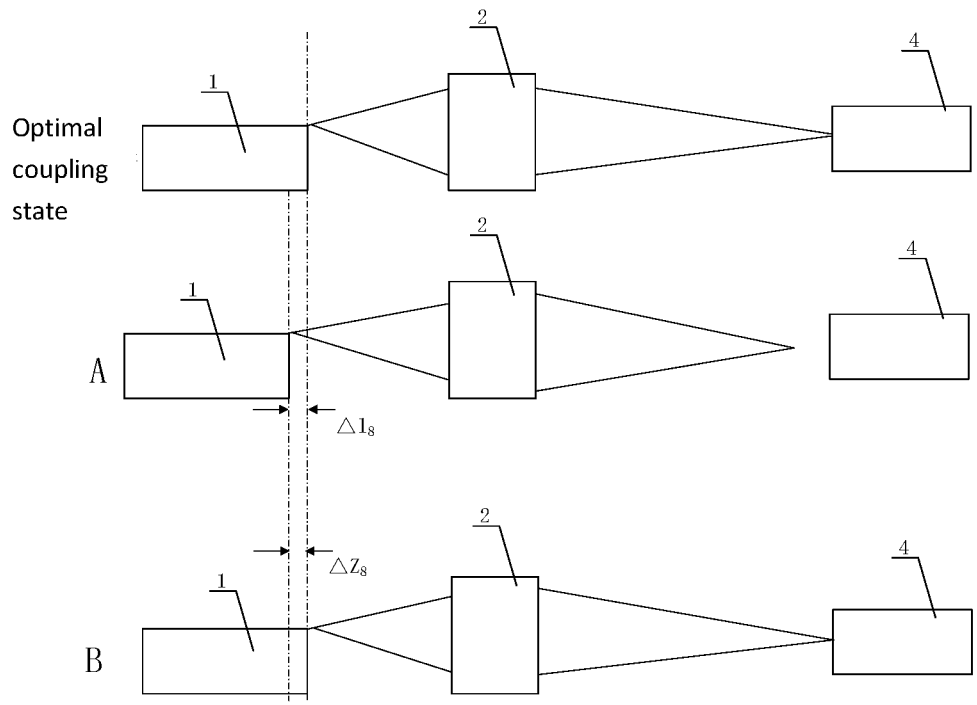
FIG. 16 is a schematic diagram of an optical path, in which the laser is offset in a direction far away from the lens, in mode 3 provided by an embodiment of the present disclosure.

It should be emphasized that in the structure of FIG. 14, one side of the second substrate 5 close to the laser 1 is embedded in the first substrate 6, and one side of the second substrate 5 far away from the laser 1 is in a free state. When the laser 1 is set during processing, it is deliberately offset by $\Delta l_8$ in the direction back to the lens 2 (as shown in figure A in FIG. 16); then when the specific working temperature increases, the second substrate 5 expands (elongates) to drive the lens 2 to offset in the direction far away from the laser 1, and the coupling efficiency is increased (as shown in figure B in FIG. 16). When the elongation reaches $\Delta Z_4 = \Delta l_4$, it will return to the optimal coupling state.

In the present embodiment of the present disclosure, a setting of the eighth designated distance $\Delta l_8$ specifically includes:

determining a maximum working temperature $T_1$ of the emission optical power stabilization assembly during actual working, and $T_1$ is larger than $T_0$, and then according to a following relational expression:

$$\Delta l_8 = \varepsilon d(T_1 - T_0);$$

calculating the eighth specified distance $\Delta l_8$, wherein $\Delta Z_8 = \varepsilon d(T_1 - T_0)$, where $\varepsilon$ is the thermal expansion coefficient of the second substrate material, d is the length of the freely telescopic portion of the second substrate, and $T_0$ is the initial temperature of the emission optical power stabilization assembly.

Embodiment 10

Embodiment 10 of the present disclosure is an example of describing in detail mode 3 in embodiment 1, and what is used in the present embodiment is that the coupling deviation in the corresponding initial state is realized by adjusting the initial position of the optical fiber coupling port 4 during processing, which is different from embodiment 8, in which it is realized by adjusting the initial position of the lens during processing, and which is different from embodiment 9, in which it is realized by adjusting the initial position of the laser during processing. Similarly, referring to the structure shown in FIG. 14, in the present embodiment, the optical-path-displacement-compensation-based emission optical power stabilization assembly also includes a laser 1, a lens 2, and an optical fiber coupling port 4.

the lens 2 and the optical fiber coupling port 4 are located on the first substrate 6, and the laser 1 is located on the second substrate 5. The length of the second substrate 5 changes along with the change of the temperature (for example, it elongates as the temperature increases, and it shortens as the temperature decreases). In the present embodiment, it is preferable to pay attention to a scene where the working temperature increases.

When the optical fiber coupling port 4 is set on the first substrate 6, it is offset back to the lens 2 by a ninth specified distance $\Delta l_9$ (this pattern corresponds to the implementation mode in FIG. 14) or is offset face to the lens 2 by the ninth specified distance $\Delta l_9$ on the optical axis relative to an optimal coupling point with the laser 1 and the optical fiber coupling port 4 (in the present embodiment, the corresponding implementation structure diagram is not separately provided. However, the structure shown in FIG. 14 can be derived on the basis of the transformation mode between FIG. 11 and FIG. 9, which will not be repeated here).

One end of the second substrate 5 is tightly connected with the first substrate 6, which is used for the length of the other end of the second substrate 5 can be elongated along with the increase of temperature when the outside temperature increases, so that the second substrate 5 drives the laser 1 to offset a telescopic offset $\Delta Z_9$ to compensate the ninth specified distance $\Delta l_9$ when the emission optical power stabilization assembly is close to the maximum working temperature.

Since the present embodiment is a technical solution designed on the basis of the same inventive concept as embodiment 2, the corresponding principle description and the structural detail expansion in embodiment 2 are also applicable to the present embodiment of the present disclosure, and details are not described herein again.

Figure 17:
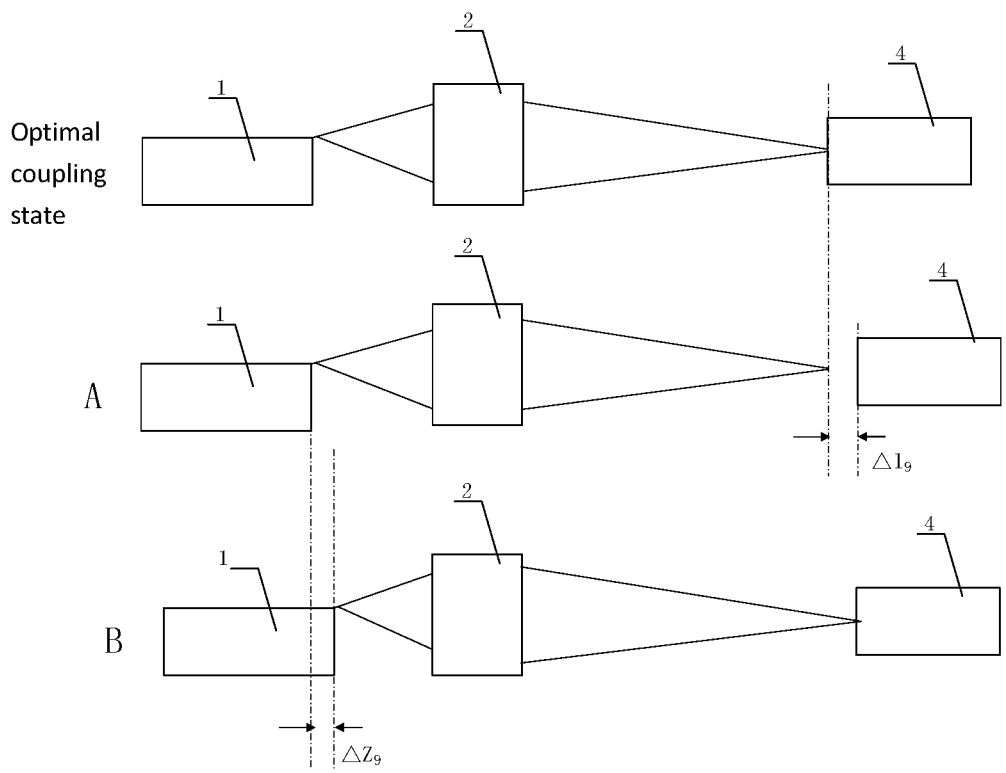
FIG. 17 is a schematic diagram of the optical path, in which the optical fiber coupling port is offset in a direction far away from the lens, in mode 3 provided by an embodiment of the present disclosure.

It should be emphasized that in the structure of FIG. 14, one side of the second substrate 5 close to the laser 1 is embedded in the first substrate 6, and one side of the second substrate 5 far away from the laser 1 is in a free state. When the optical fiber coupling port 4 is set during processing, it is deliberately offset by $\Delta l_9$ (as shown in figure A in FIG. 17) in the direction back to the lens 2 (as shown in FIG. 17, i.e. the direction towards right); then when the specific working temperature increases, the second substrate 5 expands (elongates) to drive the laser 1 to offset towards the lens 2 (refer to the structure diagram shown in FIG. 14), and the coupling efficiency is increased (as shown in figure B in FIG. 17). When the elongation reaches $\Delta Z_9$, it will return to the optimal coupling state.

In the present embodiment, a setting of the ninth designated distance $\Delta l_9$ specifically includes:

determining a maximum working temperature $T_1$ of the emission optical power stabilization assembly during actual working, and $T_1$ is larger than $T_0$, and then according to a following relational expression:

$$\Delta l_9 = \alpha \varepsilon d(T_1 - T_0);$$

calculating the ninth specified distance $\Delta l_9$, wherein $\Delta Z_9 = \varepsilon d(T_1 - T_0)$, where $\varepsilon$ is the thermal expansion coefficient of the second substrate material, d is the length of the freely telescopic portion of the second substrate, $T_0$ is the initial temperature of the emission optical power stabilization assembly, and $\alpha$ is the axial magnification.

In addition, it is also pointed out in the present embodiment that the second substrate is integral forming or combination forming, the combined implementation mode of which is particularly suitable for the case when the laser is set on the second substrate introduced in embodiment 8, embodiment 9 and embodiment 10, and thus the telescopic directivity property is improved.

Figure 18:
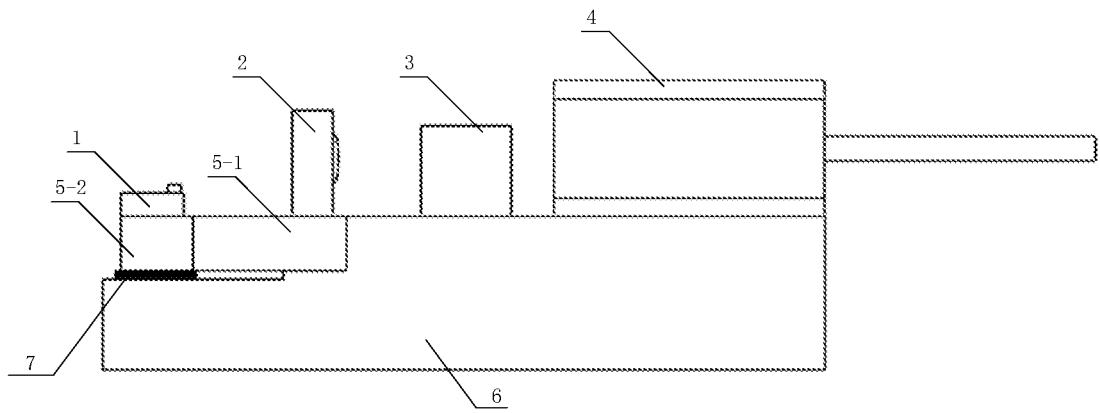
FIG. 18 is a schematic structural diagram of a device, in which the second substrate is realized through an assembly, in mode 3 provided by an embodiment of the present disclosure.
Figure 19:
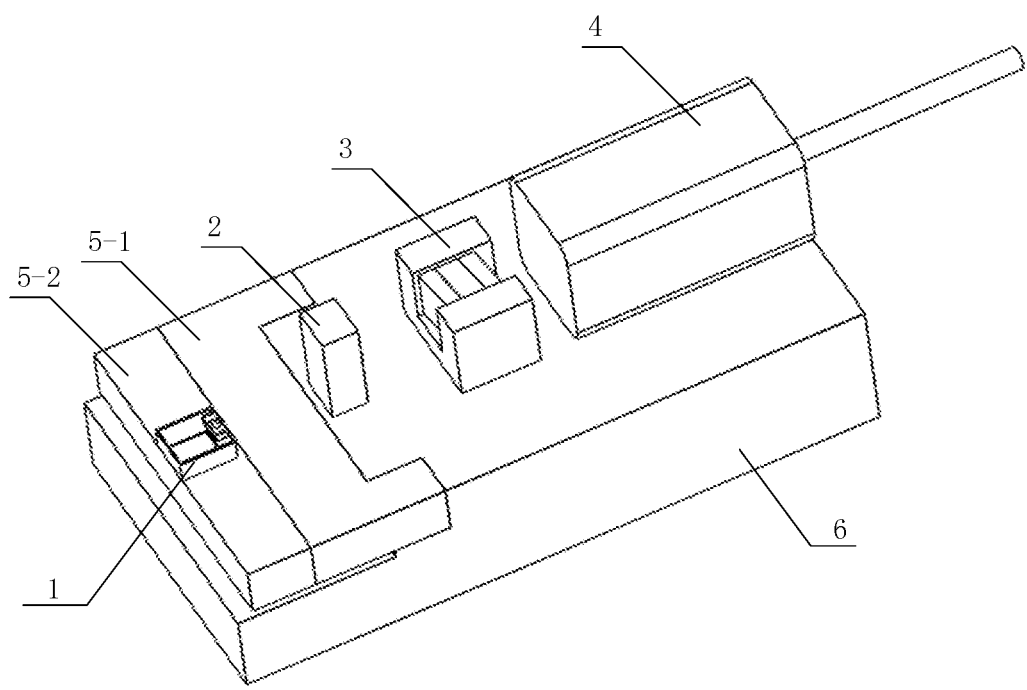
FIG. 19 is a schematic structural diagram of a device, in which the second substrate is realized through an assembly, in mode 3 provided by an embodiment of the present disclosure.

As shown in FIG. 18 and FIG. 19, FIG. 18 is a front view of FIG. 19. In FIG. 18 and FIG. 19, the second substrate 5 is formed by combining the tungsten copper 5-2 and the organic matter 5-1, wherein the black under the second substrate in FIG. 18 represents the thermal grease, which can enhance the thermal conductivity while not affecting the telescopic movement of the tungsten copper 5-2 in a small range. The tungsten copper 5-2 and the organic matter 5-1 can be fixed through glue.

The above description is only the preferred embodiments of the present disclosure and is not intended to limit the present disclosure. Any modification, equivalent replacement, and improvement made within the spirit and principle of the present disclosure shall be included in the protection of the present disclosure.

What is claimed is:

1. An optical-path-displacement-compensation-based emission optical power stabilization assembly, wherein the assembly comprises a laser, a lens and an optical fiber coupling port, the laser, the lens, and the optical fiber coupling port being set on a first substrate and a second substrate according to a preset arrangement scheme, wherein an expansion coefficient of the second substrate is larger than that of the first substrate;

the arrangement scheme enabling an initial distance between the laser and the lens, an initial distance between the lens and the optical fiber coupling port, and/or an initial distance between the laser and the optical fiber coupling port to deviate respective optimal coupling distances from an optimal coupling point for a preset value; and the arrangement scheme enabling one or more objects among the laser, the lens, and the optical fiber coupling port which are fixed on the second substrate to generate an offset along with an elongation action of the second substrate when a working temperature of the emission optical power stabilization assembly increases, and the offset is used to compensate the preset value, so that the laser, the lens, and/or the optical fiber coupling port are close to the optimal coupling point.

2. The optical-path-displacement-compensation-based emission optical power stabilization assembly of claim 1, wherein the arrangement scheme comprises:

the laser and the lens being on the first substrate, and the optical fiber coupling port being on the second substrate; or, the laser and the optical fiber coupling port being on the first substrate, and the lens being on the second substrate; or, the lens and the optical fiber coupling port being on the first substrate, and the laser being on the second substrate.

3. The optical-path-displacement-compensation-based emission optical power stabilization assembly of claim 2, wherein when the laser and the lens are on the first substrate, and the optical fiber coupling port is on the second substrate, the arrangement scheme further comprises:

an initial position of the lens on the first substrate being offset on an optical axis relative to an optimal coupling point for a coupling of the lens with the laser and the optical fiber coupling port towards the optical fiber coupling port by a first specified distance $\Delta l_1$ or is offset towards the laser by a first specified distance $\Delta l_1$;

one end of the second substrate being tightly connected with the first substrate, which is used for a length of another end of the second substrate can be elongated along with an increase of temperature when an outside temperature increases, whereby driving, by the second substrate, the optical fiber couple port to offset a telescopic offset $\Delta Z_1$ to compensate the first specified distance $\Delta l_1$ when the emission optical power stabilization assembly is close to a maximum working temperature, enabling the laser, the lens and the optical fiber coupling port to close to the optimal coupling point.

4. The optical-path-displacement-compensation-based emission optical power stabilization assembly of claim 3, wherein a setting of the first specified distance $\Delta l_1$ comprises:

determining the maximum working temperature $T_1$ of the emission optical power stabilization assembly during actual working, and $T_1$ is larger than $T_0$, and then according to a following relational expression:

$$\Delta l_1 = \frac{\varepsilon d(T_1 - T_0)}{\alpha - 1},$$

calculating the first specified distance $\Delta l_1$, wherein $\Delta Z_1 = \varepsilon d(T_1 - T_0)$, where $\varepsilon$ is a thermal expansion coefficient of material of the second substrate, d is a length of a freely telescopic portion of the second substrate, $T_0$ is an initial temperature of the emission optical power stabilization assembly, and $\alpha$ is an axial magnification.

5. The optical-path-displacement-compensation-based emission optical power stabilization assembly of claim 1, wherein when the laser and the lens are on the first substrate, and the optical fiber coupling port is on the second substrate, the arrangement scheme comprises:

the initial position of the laser on the first substrate being offset towards the side where the lens is located by a second specified distance $\Delta l_2$ on the optical axis relative to the optimal coupling point for a coupling of the laser with the lens and the optical fiber coupling port;

one end of the second substrate being tightly connected with the first substrate, which is used for a length of the other end of the second substrate being capable of elongating along with an increase of temperature when an outside temperature increases, thereby enabling the second substrate to drive the optical fiber coupling port to move a telescopic offset $\Delta Z_2$ so as to compensate the second specified distance $\Delta l_2$ when the emission optical power stabilization assembly is close to a maximum working temperature, and then enabling the laser, the lens and the optical fiber coupling port to close to the optimal coupling point.

6. The optical-path-displacement-compensation-based emission optical power stabilization assembly of claim 5, wherein setting of the second specified distance $\Delta l_2$ comprises:

determining the maximum working temperature $T_1$ of the emission optical power stabilization assembly during actual working, and $T_1$ is larger than $T_0$, and then according to a following relational expression:

$$\Delta l_2 = \frac{\varepsilon d(T_1 - T_0)}{a},$$

calculating the second specified distance $\Delta l_2$, wherein $\Delta Z_2 = \varepsilon d(T_1 - T_0)$, where $\varepsilon$ is a thermal expansion coefficient of material of the second substrate, d is a length of a freely telescopic portion of the second substrate, $T_0$ is the initial temperature of the emission optical power stabilization assembly, and $\alpha$ is an axial magnification.

7. The optical-path-displacement-compensation-based emission optical power stabilization assembly of claim 1, wherein when the laser and the lens are on the first substrate, and the optical fiber coupling port is on the second substrate, then the arrangement scheme further comprises:

an initial position of the optical fiber coupling port on the second substrate being offset on an optical axis relative to an optimal coupling point for a coupling of the laser with the lens and the optical fiber coupling port towards a side where the lens is located by a third specified distance $\Delta l_3$ or is offset back to the side where the lens is located by the third specified distance $\Delta l_3$;

one end of the second substrate being tightly connected with the first substrate, which is used for a length of another end of the second substrate being capable of elongating along with an increase of temperature when an outside temperature increases, thereby driving, by the second substrate, the optical fiber coupling port a telescopic offset $\Delta Z_3$ to compensate the third specified distance $\Delta l_3$ when the emission optical power stabilization assembly is close to a maximum working temperature, and then enabling the laser, the lens and the optical fiber coupling port to close to the optimal coupling point.

8. The optical-path-displacement-compensation-based emission optical power stabilization assembly of claim 7, wherein a setting of the third specified distance $\Delta l_3$ specifically comprises:

determining the maximum working temperature $T_1$ of the emission optical power stabilization assembly during actual working, and $T_1$ is larger than $T_0$, and then according to a following relational expression:

$$\Delta l_3 = \varepsilon d(T_1 - T_0),$$

calculating the third specified distance $\Delta l_3$, wherein $\Delta Z_3 = \varepsilon d(T_1 - T_0)$, where $\varepsilon$ is a thermal expansion coefficient of material of the second substrate, d is a length of the freely telescopic portion of the second substrate, and $T_0$ is an initial temperature of the emission optical power stabilization assembly.

9. The optical-path-displacement-compensation-based emission optical power stabilization assembly of claim 1, wherein when the laser and the optical fiber coupling port are on the first substrate, and the lens is on the second substrate, the arrangement scheme further comprises:

an initial position of the lens on the second substrate being offset on the optical axis relative to an optimal coupling point for a coupling of the lens with the laser and the optical fiber coupling port towards the optical fiber coupling port by a fourth specified distance $\Delta l_4$ or is offset towards the laser by the fourth specified distance $\Delta l_4$;

one end of the second substrate being tightly connected with the first substrate, which is used for a length of another end of the second substrate being capable of elongating along with an increase of temperature when an outside temperature increases, thereby driving, by the second substrate, the lens to offset a telescopic offset $\Delta Z_4$ to compensate the fourth specified distance $\Delta l_4$ when the emission optical power stabilization assembly is close to a maximum working temperature, and then enabling the laser, the lens and the optical fiber coupling port to close to the optimal coupling point.

10. The optical-path-displacement-compensation-based emission optical power stabilization assembly of claim 9, wherein setting of the fourth specified distance $\Delta l_4$ specifically comprises:

determining the maximum working temperature $T_1$ of the emission optical power stabilization assembly during actual working, and $T_1$ is larger than $T_0$, and then according to a following relational expression:

$$\Delta l_4 = \varepsilon d(T_1 - T_0),$$

calculating the fourth specified distance $\Delta l_4$, wherein $\Delta_4 = \varepsilon d(T_1 - T_0)$, where $\varepsilon$ is a thermal expansion coefficient of a second substrate material, d is a length of a freely telescopic portion of the second substrate, and $T_0$ is an initial temperature of the emission optical power stabilization assembly.

11. The optical-path-displacement-compensation-based emission optical power stabilization assembly of claim 1, wherein when the laser and the optical fiber coupling port are on the first substrate, and the lens is on the second substrate, the arrangement scheme further comprises:

an initial position of the laser on the first substrate being offset on the optical axis relative to an optimal coupling point for a coupling of the laser with the lens and the optical fiber coupling port towards a side where the lens is located by a fifth specified distance $\Delta l_5$ or is offset back to the side where the lens is located by the fifth specified distance $\Delta l_5$;

one end of the second substrate being tightly connected with the first substrate, which is used for a length of another end of the second substrate being capable of elongating along with an increase of temperature when an outside temperature increases, thereby enabling an telescopic offset $\Delta Z_5$, driven by the second substrate, of the lens to compensate a coupling deviation caused by the fifth specified distance $\Delta l_5$ when the emission optical power stabilization assembly is close to a maximum working temperature, so as to enable the laser, the lens and the optical fiber coupling port to close to the optimal coupling point.

12. The optical-path-displacement-compensation-based emission optical power stabilization assembly of claim 11, wherein a setting of the fifth specified distance $\Delta l_5$ specifically comprises:

determining the maximum working temperature $T_1$ of the emission optical power stabilization assembly during actual working, and $T_1$ is larger than $T_0$, and then according to a following relational expression:

$$\Delta l_5 = \frac{(\alpha - 1)\varepsilon d(T_1 - T_0)}{\alpha},$$

calculating the fifth specified distance $\Delta l_5$, wherein $\Delta Z_5 = \varepsilon d(T_1 - T_0)$, where c is a thermal expansion coefficient of a second substrate material, d is a length of a freely telescopic portion of the second substrate, $T_0$ is an initial temperature of the emission optical power stabilization assembly, and a is an axial magnification.

13. The optical-path-displacement-compensation-based emission optical power stabilization assembly of claim 1, wherein the laser and the optical fiber coupling port are on a first substrate, and the lens is on a second substrate, the arrangement scheme further comprises:

an initial position where the optical fiber coupling port is located on the second substrate being offset on the optical axis relative to an optimal coupling point for a coupling of the optical fiber coupling port with the laser and the lens towards a side far away from the lens by a sixth specified distance $\Delta l_6$ or is offset towards a side close to the lens by the sixth specified distance $\Delta l_6$;

one end of the second substrate being tightly connected with the first substrate, which is used for a length of another end of the second substrate being capable of elongating along with an increase of temperature when an outside temperature increases, thereby enabling the second substrate to drive the lens to move a telescopic offset $\Delta Z_6$ so as to compensate the sixth specified distance $\Delta l_6$ when the emission optical power stabilization assembly is close to a maximum working temperature, and then enabling the laser, the lens and the optical fiber coupling port to close to the optimal coupling point.

14. The optical-path-displacement-compensation-based emission optical power stabilization assembly of claim 13, wherein a setting of the sixth specified distance $\Delta l_6$ specifically comprises:

determining the maximum working temperature $T_1$ of the emission optical power stabilization assembly during actual working, and $T_1$ is larger than $T_0$, and then according to a following relational expression:

$$\Delta l_6 = (\alpha - 1)\varepsilon d(T_1 - T_0),$$

calculating the first specified distance $\Delta l_6$, wherein $\Delta Z_6 = \varepsilon d(T_1 - T_0)$, where $\varepsilon$ is a thermal expansion coefficient of a second substrate material, d is a length of a freely telescopic portion of the second substrate, $T_0$ is an initial temperature of the emission optical power stabilization assembly, and a is an axial magnification.

15. The optical-path-displacement-compensation-based emission optical power stabilization assembly of claim 1, wherein when the laser and the optical fiber coupling port are on the first substrate, and the laser is on the second substrate, the arrangement scheme further comprises:

an initial position of the lens on the first substrate being offset on the optical axis relative to an optimal coupling point for a coupling of the lens with the laser and the optical fiber coupling port towards a side where the optical fiber coupling port is located by a seventh specified distance $\Delta l_7$ or is offset towards a side where the laser is located by a seventh specified distance $\Delta l_7$;

one end of the second substrate being tightly connected with the first substrate, which is used for a length of another end of the second substrate being capable of elongating along with an increase of temperature when an outside temperature increases, thereby enabling the second substrate to drive the laser to offset a telescopic offset $\Delta Z_7$ to compensate the seven specified distance $\Delta l_7$ when the emission optical power stabilization assembly is close to a maximum working temperature, so as to enable the laser, the lens and the optical fiber coupling port to close to the optimal coupling point.

16. The optical-path-displacement-compensation-based emission optical power stabilization assembly of claim 15, wherein a setting of the seventh specified distance $\Delta l_7$ specifically comprises:

determining the maximum working temperature $T_1$ of the emission optical power stabilization assembly during actual working, and $T_1$ is larger than $T_0$, and then according to the following relational expression:

$$\Delta l_7 = \frac{\alpha \varepsilon d(T_1 - T_0)}{\alpha - 1},$$

calculating the seventh specified distance $\Delta l_7$, wherein $\Delta Z_7 = \varepsilon d(T_1 - T_0)$, where $\varepsilon$ is a thermal expansion coefficient of a second substrate material, d is a length of a freely telescopic portion of the second substrate, $T_0$ is an initial temperature of the emission optical power stabilization assembly, and $\alpha$ is an axial magnification.

17. The optical-path-displacement-compensation-based emission optical power stabilization assembly of claim 1, wherein when the laser and the optical fiber coupling port are on the first substrate, and the laser is on the second substrate, the arrangement scheme further comprises:

an initial position of the laser on the second substrate being offset on the optical axis relative to an optimal coupling point for a coupling of the optical fiber coupling port with the laser and the lens towards a side far away from the lens by a eighth specified distance $\Delta l_8$ or is offset towards a side close to the lens by the eighth specified distance $\Delta l_8$;

one end of the second substrate being tightly connected with the first substrate, which is used for a length of another end of the second substrate being capable of elongating along with an increase of temperature when an outside temperature increases, thereby enabling the second substrate to drive the laser to offset a telescopic offset $\Delta Z_8$ to compensate the eighth specified distance $\Delta l_8$ when the emission optical power stabilization assembly is close to a maximum working temperature, so as to enable the laser, the lens and the optical fiber coupling port to close to the optimal coupling point.

18. The optical-path-displacement-compensation-based emission optical power stabilization assembly of claim 17, wherein a setting of the eighth specified distance $\Delta l_8$ specifically comprises:

determining the maximum working temperature $T_1$ of the emission optical power stabilization assembly during actual working, and $T_1$ is larger than $T_0$, and then according to a following relational expression:

$$\Delta l_8 = \varepsilon d(T_1 - T_0),$$

calculating the eighth specified distance $\Delta l_8$, wherein $\Delta Z_8 = \varepsilon d(T_1 - T_0)$, where $\varepsilon$ is a thermal expansion coefficient of a second substrate material, d is a length of a freely telescopic portion of the second substrate, and $T_0$ is an initial temperature of the emission optical power stabilization assembly.

19. The optical-path-displacement-compensation-based emission optical power stabilization assembly of claim 1, wherein when the laser and the optical fiber coupling port are on the first substrate, and the laser is on the second substrate, the arrangement scheme further comprises:

an initial position of the laser on the second substrate being offset on the optical axis relative to an optimal coupling point for a coupling of the optical fiber coupling port with the laser and the lens towards a side close to the lens by a ninth specified distance $\Delta l_9$ or towards a side far away from the lens by the ninth specified distance $\Delta l_9$;

one end of the second substrate being tightly connected with the first substrate, which is used for a length of another end of the second substrate being capable of elongating along with an increase of temperature when an outside temperature increases, thereby enabling the second substrate to drive the laser to move a telescopic offset $\Delta Z_9$ to compensate the ninth specified distance $\Delta l_9$ when the emission optical power stabilization assembly is close to a maximum working temperature, so as to enable the laser, the lens and the optical fiber coupling port to close to the optimal coupling point.

20. The optical-path-displacement-compensation-based emission optical power stabilization assembly of claim 19, wherein a setting of the ninth specified distance $\Delta l_9$ specifically comprises:

determining the maximum working temperature $T_1$ of the emission optical power stabilization assembly during actual working, and $T_1$ is larger than $T_0$, and then according to the following relational expression:

$$\Delta l_9 = \alpha \varepsilon d(T_1 - T_0),$$

calculating the ninth specified distance $\Delta l_9$, wherein $\Delta Z_9 = \varepsilon d(T_1 - T_0)$, where $\varepsilon$ is a thermal expansion coefficient of a second substrate material, d is a length of a freely telescopic portion of the second substrate, $T_0$ is an initial temperature of the emission optical power stabilization assembly, and $\alpha$ is an axial magnification.

* * * * *